United States Patent
Ramos Sparrow et al.

(10) Patent No.: US 12,438,520 B2
(45) Date of Patent: Oct. 7, 2025

(54) ELECTROACOUSTIC FILTER WITH LOW PHASE DELAY FOR MULTIPLEXED SIGNALS

(71) Applicant: RF360 Singapore Pte. Ltd., Republic Plaza (SG)

(72) Inventors: Oswaldo Ramos Sparrow, Lorient (FR); Lionel Treffon, Vallauris (FR)

(73) Assignee: RF360 Singapore Pte. Ltd., Republic Plaza (SG)

( * ) Notice: Subject to any disclaimer, the term of this patent is extended or adjusted under 35 U.S.C. 154(b) by 750 days.

(21) Appl. No.: 17/464,592

(22) Filed: Sep. 1, 2021

(65) Prior Publication Data

US 2023/0061645 A1   Mar. 2, 2023

(51) Int. Cl.
*H03H 9/56* (2006.01)
*H03H 9/13* (2006.01)
*H03H 9/54* (2006.01)

(52) U.S. Cl.
CPC .............. *H03H 9/568* (2013.01); *H03H 9/13* (2013.01); *H03H 9/547* (2013.01)

(58) Field of Classification Search
CPC ........... H03H 9/568; H03H 9/13; H03H 9/547
See application file for complete search history.

(56) References Cited

U.S. PATENT DOCUMENTS

| | | | |
|---|---|---|---|
| 6,344,705 B1 | 2/2002 | Solal et al. | |
| 2004/0119561 A1 | 6/2004 | Omote | |
| 2017/0019085 A1 | 1/2017 | Kida et al. | |
| 2017/0301992 A1 | 10/2017 | Khlat et al. | |
| 2018/0076793 A1* | 3/2018 | Khlat | H03F 1/565 |
| 2019/0158062 A1* | 5/2019 | Horita | H03H 9/605 |
| 2019/0181835 A1* | 6/2019 | Timme | H03H 11/1291 |
| 2020/0366271 A1* | 11/2020 | Kim | H03H 9/568 |
| 2021/0184324 A1 | 6/2021 | Sato | |
| 2021/0288630 A1* | 9/2021 | Park | H03H 9/542 |
| 2022/0109429 A1* | 4/2022 | Guyette | H03H 9/706 |

FOREIGN PATENT DOCUMENTS

WO   2017083792 A1   5/2017

OTHER PUBLICATIONS

International Search Report and Written Opinion—PCT/EP2022/072508—ISA/EPO—Jan. 5, 2023.

* cited by examiner

*Primary Examiner* — Samuel S Outten
(74) *Attorney, Agent, or Firm* — Polsinelli

(57) ABSTRACT

Aspects of the disclosure relate to wireless communication filtering. One aspect is an apparatus including a first acoustic resonator that is part of a first bandpass filter having a first passband and coupled to a circuitry connection port and a communication connection port, and a second acoustic resonator that is part of one of a second bandpass filter or a notch filter. The apparatus further includes a third acoustic resonator that is part of the first bandpass filter, and a fourth acoustic resonator that is part of the second bandpass filter or the notch filter.

24 Claims, 15 Drawing Sheets

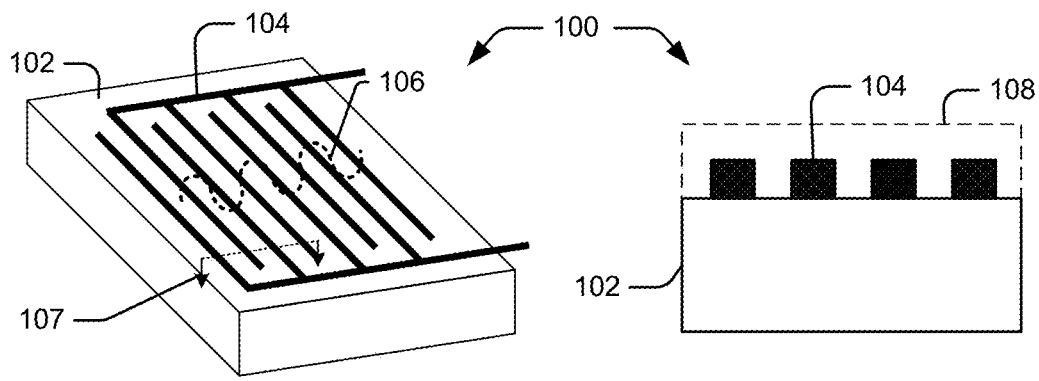
FIG. 1A
FIG. 1B
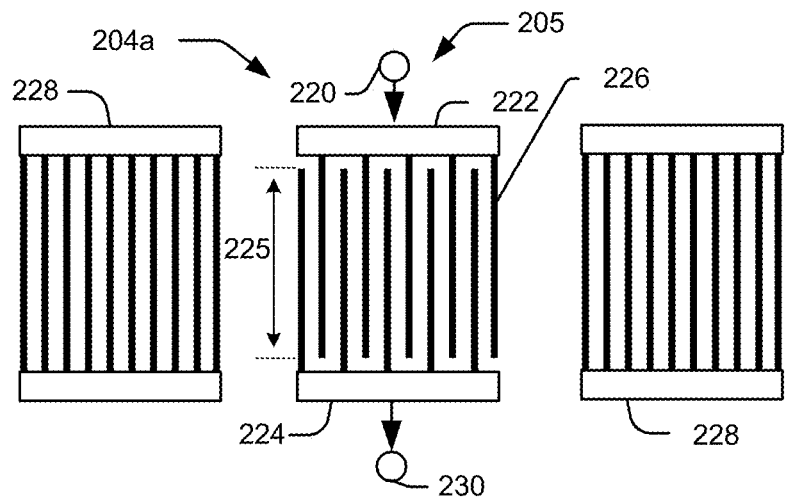
FIG. 2A
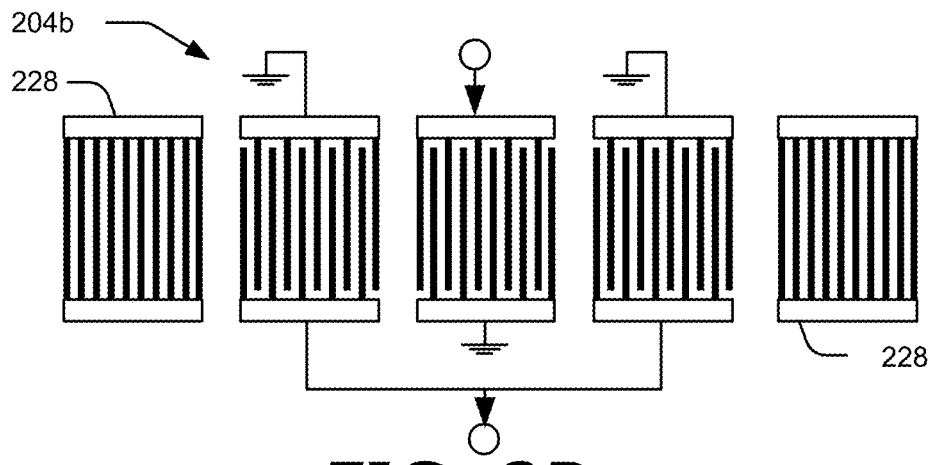
FIG. 2B

ELECTROACOUSTIC FILTER WITH LOW PHASE DELAY FOR MULTIPLEXED SIGNALS

FIELD

The present disclosure relates generally to wireless communication, and in particular to filters that can be implemented with electroacoustic resonators and that can be used in a multi-band communication device.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Aspects of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. The smaller filter device permits acoustic resonators to be used in electronic devices having size constraints, such as the electronic devices enumerated above (e.g., particularly including portable electronic devices such as cellular phones).

SUMMARY

Communication technologies are changing to improve communication performance by using additional frequency bands with associated filters. For instance, to implement additional frequency usage, the number of bands in use by a single transceiver circuit can be increased with dynamic spectrum sharing (DSS) and carrier aggregation (CA). In such devices, different RF filters can be coupled to a single antenna to efficiently use device resources.

Aspects of the present disclosure include filters that can be used in multiple different bands or all bands for certain devices. In some cases, the filters can be configured to meet DSS and CA usage requirements. For example, aspects of the present disclosure include filter circuits having one or more filter blocks (e.g., filter stages or parts of a filter circuit) including both series resonators (e.g., resonators in the signal or transmission path) in a split pole configuration and shunt resonators (e.g., resonators connected between the signal path and a reference voltage or other node outside the signal path) in a split pole configuration. In some examples, at least one series resonator and at least one shunt resonator are configured for passband performance, and at least one series resonator and at least one shunt resonator are configured for an additional filter function.

The above-described filter block configurations with sets of transmission and shunt resonators allow a standardized structure to address many different filter functions in support of DSS and CA performance. The devices and wireless communication apparatuses described herein can improve device performance to meet thresholds associated with communication standards for such multi-band communication systems, while simplifying design and manufacturing with a standardized filter structure for a device's communication bands.

In some aspects, a wireless communication apparatus is provided. The wireless communication apparatus includes a first acoustic resonator that is a part of a first bandpass filter having a first passband, the first acoustic resonator having a first resonator side and a second resonator side, the first resonator side coupled to a circuitry connection port, and the second resonator side coupled to a communication connection port; a second acoustic resonator that is part of one of a second bandpass filter having a second passband or a notch filter having a stopband, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator; a third acoustic resonator that is part of the first bandpass filter, the third acoustic resonator having a first resonator side and a second resonator side, the first resonator side of the third acoustic resonator coupled to the second resonator side of the first acoustic resonator, the first resonator side of the third acoustic resonator further coupled to the second resonator side of the second acoustic resonator, the second resonator side of the third acoustic resonator coupled to a reference potential; and a fourth acoustic resonator that is part of one of the second bandpass filter or the notch filter, the fourth acoustic resonator having a first resonator side and a second resonator side, the fourth acoustic resonator coupled in parallel to the third acoustic resonator, with the first resonator side of the fourth acoustic resonator coupled to the first resonator side of the third acoustic resonator, and the second resonator side of the third acoustic resonator coupled to the second resonator side of the fourth acoustic resonator and the reference potential.

In some aspects, the wireless communication apparatus further includes a ladder network of resonators coupled to the circuitry connection port. In some cases, the ladder network of resonators includes at least one of: an additional resonator as part of one of the notch filter or the second bandpass filter; or an additional resonator as part of the first bandpass filter.

In some aspects, the second acoustic resonator is part of the notch filter and the fourth acoustic resonator is part of the notch filter; the stopband is at frequencies greater than frequencies of the first passband; a resonance value for the first acoustic resonator is greater than a resonance value for the second acoustic resonator, the resonance value for the second acoustic resonator is greater than a resonance value for the fourth acoustic resonator, and the resonance value for the fourth acoustic resonator is greater than a resonance value for the third acoustic resonator.

In some aspects, the second acoustic resonator is part of the second bandpass filter and the fourth acoustic resonator is part of the second bandpass filter; wherein a resonance value for the third acoustic resonator is greater than a resonance value for the fourth acoustic resonator, the resonance value for the fourth acoustic resonator is greater than a resonance value for the first acoustic resonator, and the resonance value for the first acoustic resonator is greater than a resonance value for the second acoustic resonator.

In some aspects, the reference potential is a ground potential.

In some aspects, the wireless communication apparatus further includes control circuitry coupled to the circuitry connection port and multiplexer circuitry coupled to the communication connection port.

In some aspects, the wireless communication apparatus further includes a combined filter configured as a bandpass filter, a first notch filter, and a second notch filter, the combined filter including the first acoustic resonator, the second acoustic resonator, the third acoustic resonator, and the fourth acoustic resonator.

In some aspects, the first acoustic resonator and the second acoustic resonator form a serial resonator network.

In some aspects, the serial resonator network is configured to define an antiresonance pass band filter frequency.

In some aspects, the serial resonator network is configured to define a first notch filter resonance.

In some aspects, the wireless communication apparatus further includes a passive network in parallel with the serial resonator network. In some cases, the passive network comprises a plurality of capacitors in parallel with the serial resonator network and a plurality of inductors in parallel with the serial resonator network. In some examples, element values of the passive network configure gamma parameters for the combined filter, the element values of the passive network configure input and output phase values for the combined filter, and the element values of the passive network further configure notch rejection values for the combined filter.

In some aspects, the third acoustic resonator and the fourth acoustic resonator form a shunt resonator network. In some cases, the shunt resonator network defines a pass band filter resonance frequency for the first bandpass filter. In some examples, the shunt resonator network modifies a notch filter antiresonance frequency for the combined filter. In some aspects, the shunt resonator network is configured to modify a coupling factor for the combined filter.

In some aspects, the wireless communication apparatus further includes an inductor coupled between a reference potential and the second resonator side of the third acoustic resonator.

In some aspects, a wireless communication apparatus is provided that includes one or more filter blocks, each filter block of the one or more filter blocks comprising a set of two or more split pole series resonators, the set of two or more split pole series resonators comprising: a first acoustic resonator configured with a first passband resonance, the first acoustic resonator having a first resonator side and a second resonator side, the first resonator side coupled to a circuitry connection port, and the second resonator side coupled to a communication connection port; and a second acoustic resonator configured with a stopband resonance, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator.

In some aspect, the set of two or more split pole series resonators further comprising: a third acoustic resonator configured with a second passband resonance, the third acoustic resonator having a first resonator side and a second resonator side, the first resonator side of the third acoustic resonator coupled to the second resonator side of the first acoustic resonator, and first resonator side of the third acoustic resonator further coupled to the second resonator side of the second acoustic resonator; and a fourth acoustic resonator configured with a stopband resonance, the fourth acoustic resonator having a first resonator side and a second resonator side, the fourth acoustic resonator coupled in parallel to the third acoustic resonator, with the first resonator side of the fourth acoustic resonator coupled to the first resonator side of the third acoustic resonator, and the second resonator side of the third acoustic resonator coupled to the second resonator side of the fourth acoustic resonator.

In some aspects, the wireless communication apparatus includes a first filter block, a second filter block, and a third filter block. In some cases, the circuitry connection port of the second filter block is coupled to the communication connection port of the first filter block, and where the circuitry connection port of the third filter block is coupled to the communication connection port of the second filter block.

In some aspects, the wireless communication apparatus further includes control circuitry coupled to the circuitry connection port of the first filter block; and an antenna coupled to the communication connection port of the third filter block.

In some aspects, the wireless communication apparatus is a cellular phone.

In some aspects, a method of filtering one or more signals in a wireless communication apparatus is provided. The method includes receiving a signal at a filter block of the wireless communication apparatus, the filter block including: a first acoustic resonator that is part of a first bandpass filter having a first passband, the first acoustic resonator having a first resonator side and a second resonator side, the first resonator side coupled to a circuitry connection port, and the second resonator side coupled to a communication connection port; a second acoustic resonator that is part of one of a second bandpass filter having a second passband or a notch filter having stopband, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator; a third acoustic resonator that is part of the first bandpass filter, the third acoustic resonator having a first resonator side and a second resonator side, the first resonator side of the third acoustic resonator coupled to the second resonator side of the first acoustic resonator, the first resonator side of the third acoustic resonator further coupled to the second resonator side of the second acoustic resonator, and the second resonator side of the third acoustic resonator coupled to a reference potential; a fourth acoustic resonator that is part of one of the second bandpass filter or the notch filter, the fourth acoustic resonator having a first resonator side and a second resonator side, the fourth acoustic resonator coupled in parallel to the third acoustic resonator, with the first resonator side of the fourth acoustic resonator coupled to the first resonator side of the third acoustic resonator, and the second resonator side of the third acoustic resonator coupled to the second resonator side of the fourth acoustic resonator and the reference potential; and filtering the signal using the filter block.

In some aspects, the acoustic resonator is a bulk acoustic wave (BAW) resonator. In some aspects, the acoustic resonator is a thin-film surface acoustic wave (SAW) resonator.

In some aspects, a wireless communication apparatus is provided. The wireless communication apparatus includes: a bandpass filter having a bandpass filter response and including a first acoustic resonator coupled between a circuitry connection port and a communication connection port, the bandpass filter further including a third acoustic resonator coupled between the first acoustic resonator and a reference potential in a shunt path; and a notch filter having a stopband filter response and including a second acoustic resonator coupled in parallel with the first acoustic resonator between the circuitry connection port and the communication connection port, the notch filter further including a fourth acoustic resonator coupled in parallel with the third acoustic resonator.

In some aspects, the fourth acoustic resonator is in the shunt path between a signal path and the reference potential.

In some aspects, the bandpass filter further includes one or more resonators of a ladder network of resonators coupled to the circuitry connection port, and wherein the ladder network of resonators includes one or more additional resonators as part of the notch filter.

In some aspects, a resonance value for the third acoustic resonator is greater than a resonance value for the fourth acoustic resonator, the resonance value for the fourth acoustic resonator is greater than a resonance value for the first acoustic resonator, and the resonance value for the first acoustic resonator is greater than a resonance value for the second acoustic resonator.

In some aspects, the apparatuses described above can include a mobile device with a camera for capturing one or more pictures. In some aspects, the apparatuses described above can include a display for displaying one or more pictures. The summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and embodiments, will become more apparent upon referring to the following specification, claims, and accompanying drawings.

BRIEF DESCRIPTION OF THE DRAWINGS

FIG. 1A is a diagram of a perspective view of an example of an electroacoustic device for use with some examples described herein.

FIG. 1B is a diagram of a side view of the electroacoustic device of FIG. 1A.

FIG. 2A is a diagram of a top view of an example of an electrode structure of an electroacoustic device for use with some examples described herein.

FIG. 2B is a diagram of a top view of another example of an electrode structure of an electroacoustic device for use with some examples described herein.

DETAILED DESCRIPTION

Figure 3A:
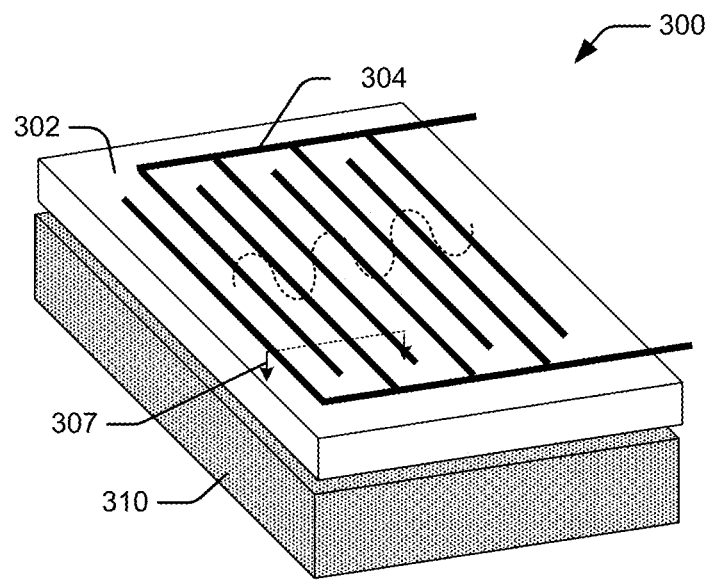
FIG. 3A is a diagram of a perspective view of another example of an electroacoustic device for use with some examples described herein.

The detailed description set forth below in connection with the appended drawings is intended as a description of exemplary implementations and is not intended to represent the only implementations in which the invention may be practiced. The term "exemplary" used throughout the description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Aspects described herein include devices and wireless communication apparatuses that can use filters with one or more filter blocks (e.g., stages or rungs of a ladder structure)

including both series resonators in a split pole (e.g., closely connected resonators, as described in more detail below) configuration and shunt resonators in a split pole configuration. The apparatuses can use such filters to improve communication performance and compliance with requirements associated with use of multiple communication bands, such as with dynamic spectrum sharing (DSS) and carrier aggregation (CA) in specific communication environments. To maintain performance, certain thresholds are used for filter performance to allow communication in different frequency bands by the same device. As additional bands are added to existing multi-band systems, current filters and multiplexers may not meet performance thresholds. In some examples, a filter with improved device operation in such an environment is provided, where configuration of filters and filter block stages allows compliance with performance thresholds. Such device improvements can, in some examples, be generated while improving device reliability and manufacturability with standardized filter blocks that allow compliance with many different communication environments.

Electroacoustic devices are being designed to cover more frequency ranges (e.g., 500 MHz to 6 GHz), to have higher bandwidths (e.g., up to 25%), and to have improved efficiency and performance. Examples of such electroacoustic devices include bulk acoustic wave (BAW) resonators (which use layers of resonant materials) and surface acoustic wave (SAW) resonators (which employ electrode structures on a surface of a piezoelectric material). In general, certain SAW resonators are designed to cause propagation of an acoustic wave in a particular direction through the piezoelectric material (e.g., main acoustic wave mode).

In addition to the SAW devices described herein, other resonators can be used in radio frequency (RF) filters in accordance with the examples described herein. For example, BAW or thin-film bulk acoustic resonator (FBAR or TFBAR) devices include a piezoelectric material manufactured with thin films sandwiched between two electrodes and isolated from vibrations in a surrounding substrate. The piezoelectric films of such devices can have thicknesses in the range of several micrometers down to fractions of a micrometer, and can resonate in frequency ranges above 100 Megahertz (MHz). As described herein, SAW, BAW, and other devices can be referred to as resonators or electroacoustic resonators. Aspects of the present disclosure are directed to RF filters for filtering a signal for a particular frequency or range of frequencies, particularly in a multi-band context, where multiple filters can be used to send signals to a shared antenna. Aspects of the present disclosure use resonant structures added to RF filters to modify the phase characteristics of the antenna reflection coefficients for the filters to reduce the interactions that different (e.g., counter) band-signals have with the particular filter, and thereby improve communication performance.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types (e.g., BAW or TFBAR) that may be constructed based on the principles described herein. The electroacoustic device 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobite (LiNbO3), doped variants of these, or other piezoelectric materials. It should be appreciated that more complicated layer stacks (e.g., 4 layers, 6 layers, etc.) including layers of various materials may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

FIG. 2A is a diagram of a top view of an example of an electrode structure 204a of an electroacoustic device 100. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along the busbars 222 and 224, there is an overlap region including a central region where a portion of one finger overlaps with a portion of an adjacent finger (as illustrated by the central region 225). The central region 225 including the overlap may be referred to as the aperture, track, or active region where electric fields are produced between fingers 226 to cause an acoustic wave to propagate in the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. The distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates is a self-resonance (also called a "main-resonance") frequency of the electrode structure 204a. The frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output such as one of the first terminal 220 or the second terminal 230 while the other terminal may function as an input.

A variety of electrode structures are possible. FIG. 2A may generally illustrate a one-port configuration. Other 2-port configurations are also possible. For example, the electrode structure 204a may have an input IDT 205 where each terminal 220 and 230 functions as an input. In some such structures, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

FIG. 2B is a diagram of a top view of another aspect of an electrode structure 204b of an electroacoustic device 100. In some cases, a dual-mode SAW (DMS) electrode structure 204b is illustrated that is a structure which may induce multiple resonances. The electrode structure 204b includes multiple IDTs along with reflectors 228 connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

FIG. 3A is a diagram of a perspective view of another aspect of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1A) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher Q-factor as compared to the electroacoustic device 100 of FIG. 1A. The piezoelectric material 302, for example, may be Lithium tantalate (LiTaO3) or some doped variant. Another example of a piezoelectric material 302 for FIG. 3A may be Lithium niobite (LiNbO3). In general, the substrate 310 may be substantially thicker than the piezoelectric material 302 (e.g., potentially on the order of 50 to 100 times thicker as one example—or more). The substrate 310 may include other layers as 310-1, 310-2, and 310-3 (or other layers may be included between the substrate 310 and the piezoelectric material 302).

Figure 3B:
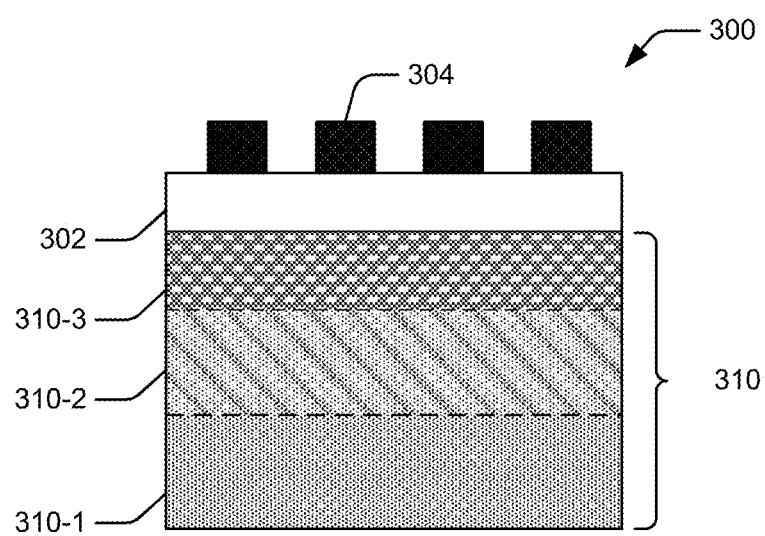
FIG. 3B is a diagram of a side view of the electroacoustic device of FIG. 3A.

FIG. 3B is a diagram of a side view of the electroacoustic device 300 of FIG. 3A showing an exemplary layer stack (along a cross-section 307). In the aspect shown in FIG. 3B, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer (e.g., silicon dioxide (SiO$_2$) or another dielectric material) that may provide temperature compensation and other properties. These sublayers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices such as between the electroacoustic device 100 of FIG. 1A and the electroacoustic device 300 of FIGS. 3A and 3B.

Figure 4:
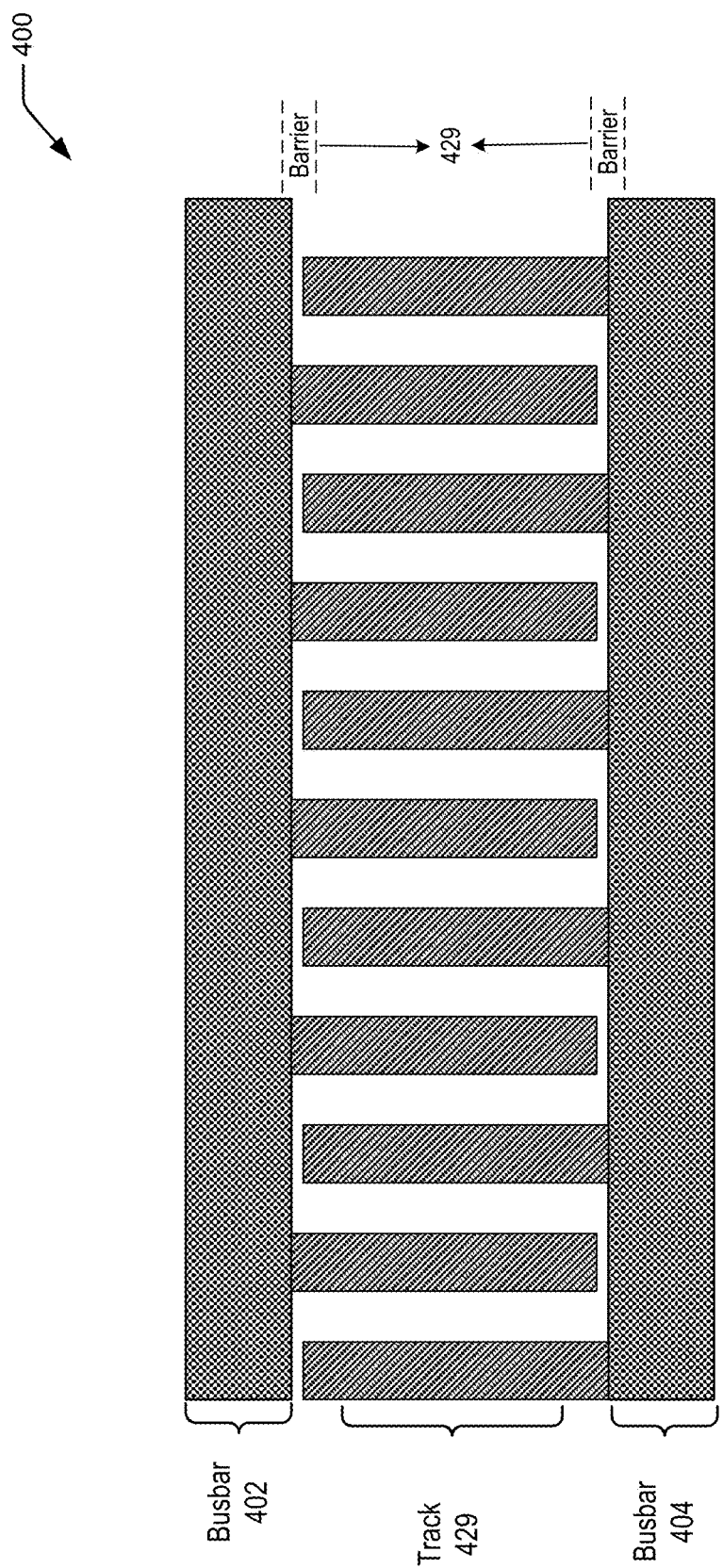
FIG. 4 is a diagram of a view of an electroacoustic device that can be used in accordance with examples described herein.

FIG. 4 is a diagram of a view of an electrode structure 400 of a resonator in accordance with some aspects. Just as above, the electrode structure 400 may be referred to as an IDT that can be fabricated on the surface of a piezoelectric material as part of the resonator. The electrode structure 400 includes first and second comb shaped electrodes. The comb teeth are within track 429, and supported by busbar 402 on one side and busbar 404 on the other side. An electrical signal excited on one side of the electrode structure is transformed into an acoustic wave that propagates in a particular direction via the piezoelectric material that electrode structure 400 is fabricated on. The acoustic wave is transformed back into an electrical signal and provided as an output.

Figure 5A:
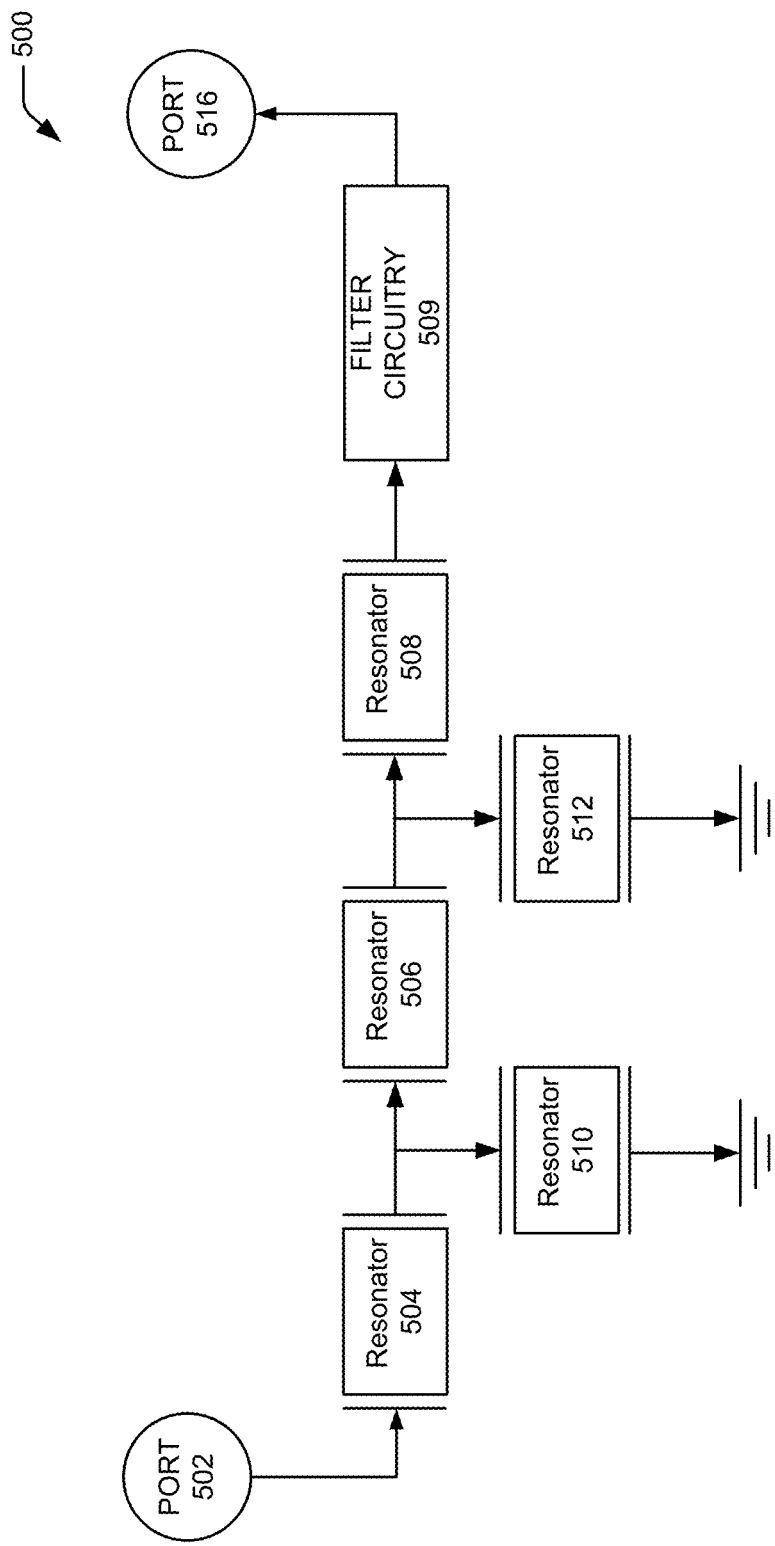
FIG. 5A is a schematic representation of aspects of a filter in accordance with examples described herein.
Figure 5B:
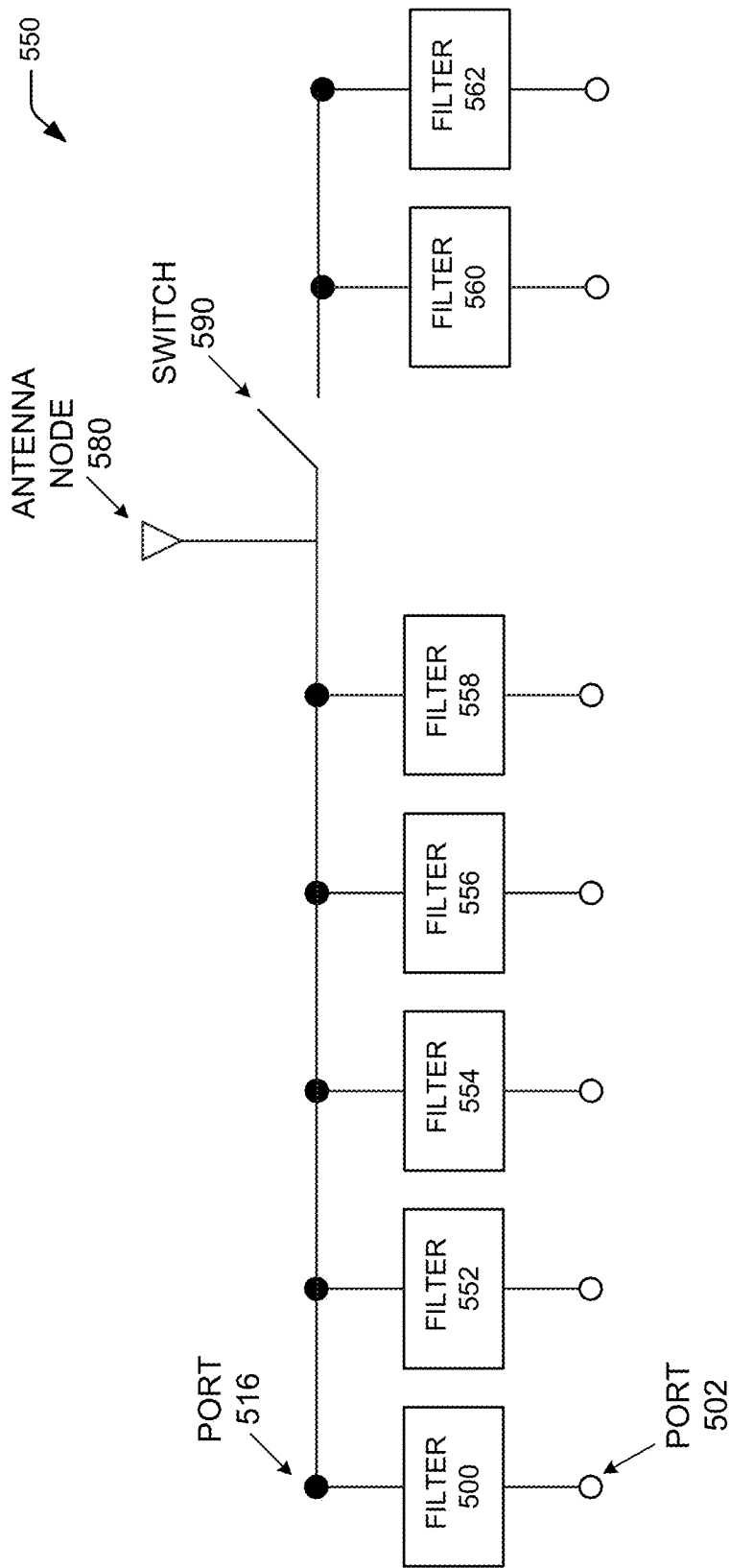
FIG. 5B is a schematic representation of a multiplexer with multiple filters configured for multi-band communications that can be used in accordance with examples described herein.

FIG. 5A is a schematic diagram of an electroacoustic filter circuit 500 that may have added filter circuitry 509 (e.g., a filter block with resonators in a split pole configuration) in accordance with the aspects described herein. The aspect of FIG. 5A includes a ladder structure. In other aspects, other structures can be used. Such a filter circuit 500 can be used for one band of a multi-band system that shares a single antenna, as illustrated by FIG. 5B and described herein. FIG. 5A is an illustration of a ladder circuit that can be used in one filter of a multiplexed multi-band system, with other bands using different filters. In accordance with aspects described herein, the filter circuitry apparatus (e.g., with aspects illustrated in FIGS. 7A, 7B, 8, 9, 10, etc.) can be used in one or all filters for different frequency bands in a multi-band device. Some filters in a device can thus use a ladder structure illustrated by FIG. 5A without the added filter circuitry 509, while one or more other filters in the device include a low phase delay apparatus in accordance with aspects described herein.

In some aspects of the filter circuit 500, the ladder of resonators 504, 506, 508, 510, and 512 can be used with a filter block having split pole resonators implemented as filter circuitry 509. In other aspects, filters with filter blocks having split pole resonators can be implemented alone or with other filter configurations besides the ladder structure of FIG. 5A. As described below, filter blocks with split pole configurations (e.g., implemented as the filter circuitry 509) may be used to improve filter performance in a multi-band environment by improving filter performance as described below.

As shown in FIG. 5A, the filter circuit 500 includes an input 502 and an output 516. Between the input 502 and the output 516, a ladder network of the resonators 504, 506, 508, 510, and 512 is provided. The resonators can be SAW or BAW resonators or any other such resonator device as detailed herein. The filter circuit 500 includes a first resonator 504, a second resonator 506, and a third resonator 508 all electrically connected in series between the input 502 and the output 516. A fourth resonator 510 (e.g., a shunt resonator) has a first terminal connected between the first resonator 504 and the second resonator 506, and a second terminal connected to a ground potential. A fifth resonator 512 (e.g., a shunt resonator) has a first terminal connected between the second resonator 506 and the third resonator 508 and a second terminal connected to a ground potential. The electroacoustic filter circuit 500 with the filtering from the above laddered resonators may, for example, be a band pass circuit having a passband within a selected frequency range.

FIG. 5B is a schematic representation of a multiplexer circuit 550 with multiple filters configured for multi-band communications using antenna node 580. The filters include filter circuit 500 from FIG. 5A, including output 516 and input 502. Additional filters 552, 554, 556, 558, 560, and 562 are shown, which can be used for corresponding bands of the multi-band communications system. In other aspects, multiplexing with any number of filters can be used. The switch 590 can isolate the filters 560 and 562 from the remaining filters when the frequency bands associated when the filters 560 and 562 are not in use. Isolating the filters 560 and 562 can improve the communication performance of the multiplexer circuit 550 by limiting interference by the filters 560 and 562 with signals from the filters (or filter circuits) 500-558 when the filters 560 and 562 are not in use (e.g., signal loss due to leakage into the filters 560 and 562 is limited when the filters 560 and 562 are disconnected by the switch). In some aspects, additional switches can be included. The additional switches can create additional groupings of filters that can be isolated by the switches. In some aspects, no switches are used, in which case all of the filters can be hard-wired at an antenna node as part of the multiplexer circuitry.

Since the introduction of carrier aggregation in the standard setting for wireless communications by the Third Generation Partnership Project (3GPP) Release 10, the number of possible band combinations has increased significantly. For inter-band non-contiguous carrier aggregation, RF front-end solutions face significant challenges because many band select filters, which can be realized as microelectroacoustic filters in surface acoustic wave or bulk acoustic wave technology, are electrically combined at a common antenna node using a multiplexer such as the multiplexer circuit 550 illustrated in FIG. 5B. Such electrical combinations can be switchable in front-end architectures, to be able to choose between different band combinations. As additional bands are added in subsequent releases, the combinations of bands become more complex with more stringent operation thresholds. Any of filter circuits 500, 552-558, or 560-562 can include filter blocks with split pole resonator configurations as described herein. In some examples, the same structure with split pole resonators can be used, with different resonator and passive element values used to provide filter performance for different frequency bands using the same design.

Figure 6:
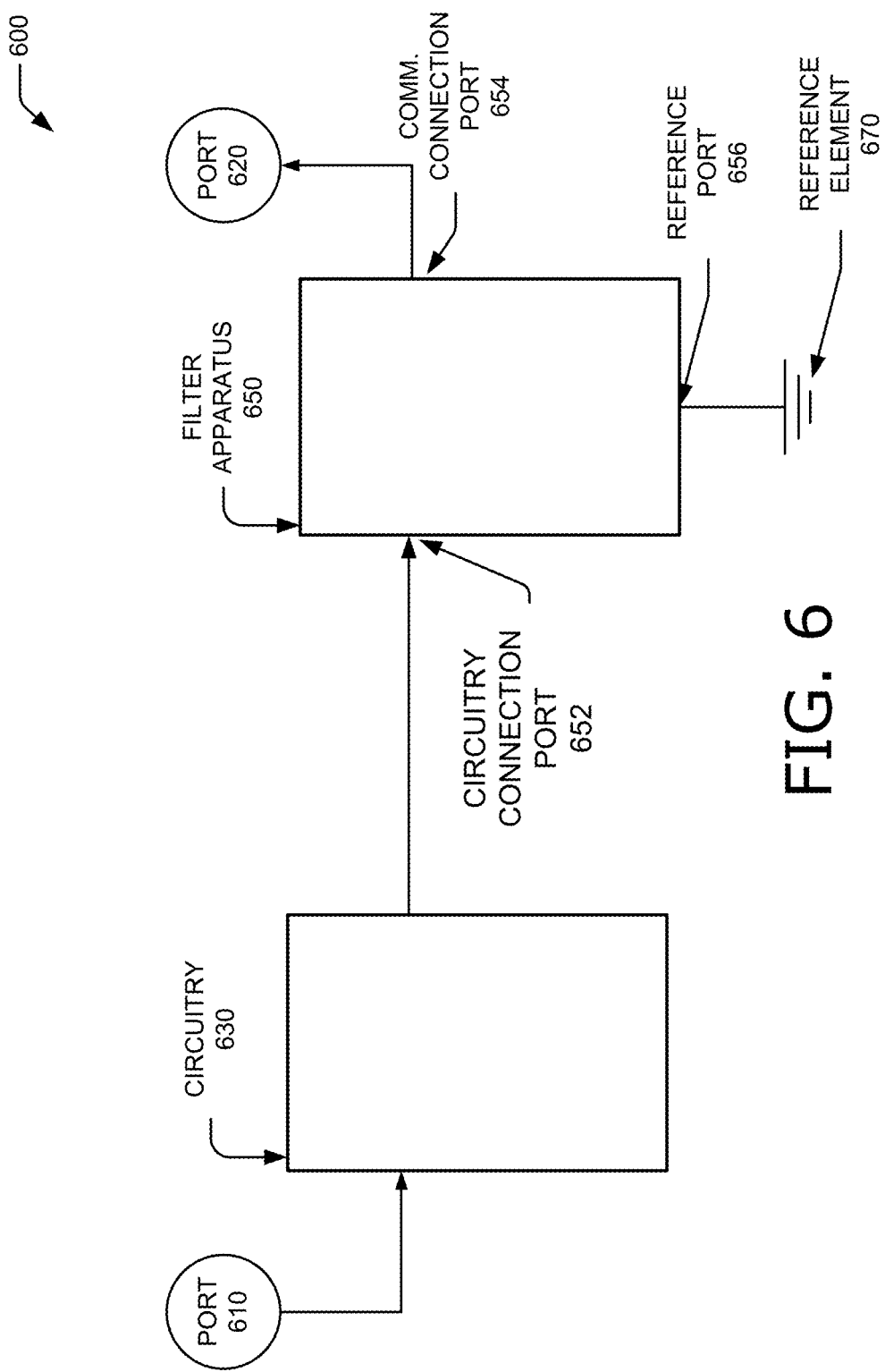
FIG. 6 is a schematic representation of aspects of a filter in accordance with examples described herein.

FIG. 6 is a schematic representation of aspects of a filter circuit 600 in accordance with aspects described herein. The filter circuit 600 can be used as any filter of the multiplexer circuit 550. The filter circuit 600 includes an input 610 (e.g., on an input, processing circuitry, or device side of circuit 600) that can be coupled to processing circuitry and an output 620 (e.g., on an output or antenna side) that can be connected to an antenna (e.g., the antenna node 580) via a multiplexing node coupled to multiple filters. The example of the filter circuit 600 in FIG. 6 is one aspect of a filter that can use a filter blocks with split pole resonator configurations in accordance with aspects described herein.

The filter apparatus 650 includes a signal connection port 652 that is coupled to the input 610 via the circuitry 630. As described herein, a port can include any node or connection point, such as connectors that create a point for connection to an external element outside of a die or particular integrated circuit, as well as internal nodes in a connection path within a die or integrated circuit. The circuitry 630 can include matching circuitry, which can be optional in some implementations. The circuitry 630 can also include additional filtering elements, such as the ladder of resonators shown in FIG. 5A. Some aspects of circuitry can include multiple low phase delay filter apparatuses (e.g., filter apparatus 650) serially connected in the signal path. In other aspects, devices can use other such combinations of one or more low phase delay wireless communication apparatuses.

The filter apparatus 650 includes connection ports, including a port 654 (e.g., a communication port or an antenna connection port or other such port on a side connected to or towards an antenna or antenna port) coupled to output 620, and a reference port 656 coupled to a reference element 670 (e.g., an electrical ground or another reference potential in a circuit design). Additional details of an example filter apparatus such as filter apparatus 650 are shown in FIGS. 7A, 7B, 8, 9, and 10 below.

Figure 7A:
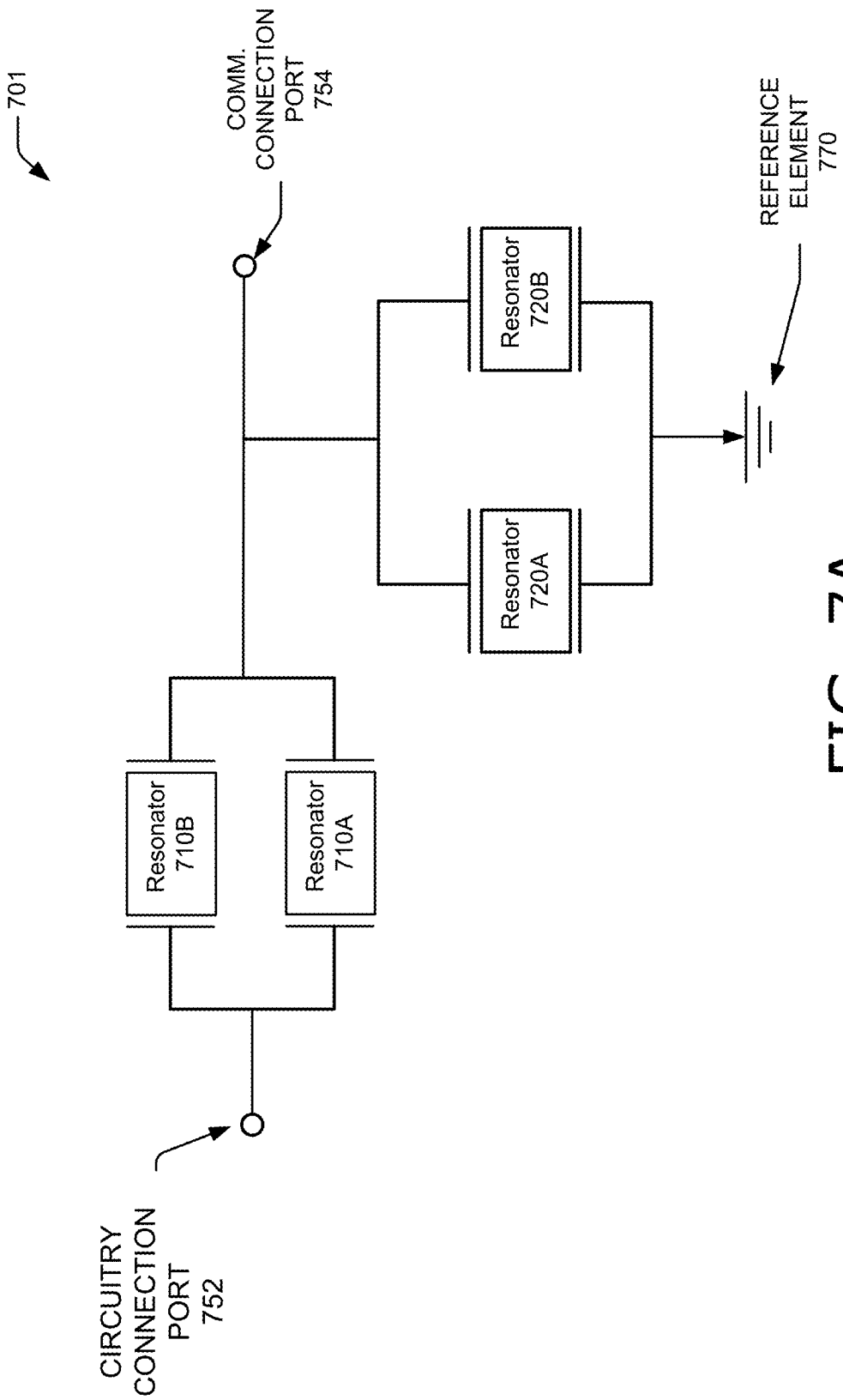
FIG. 7A is a schematic representation of aspects of a filter in accordance with examples described herein.

FIG. 7A is a schematic representation of aspects of a filter block 701 in accordance with examples described herein. The wireless communication filter block 701 can be one implementation of the wireless apparatus 650 of FIG. 6. The filter block 701 includes a reference element 770, a circuitry connection port 752, and a communication connection port 754. The circuitry connection port 752 may be connected to control circuitry of an apparatus, such as the circuitry 630, that is used to process data received at a wireless communication apparatus, or generate data for transmission by a wireless communication apparatus. The filter block 701 also includes resonator 710A and resonator 710B, which are series resonators (e.g., signal path resonators or transmission resonators in the transmission path between the circuitry connection port 752 and the communication connection port 754, as opposed to shunt resonators coupled from the transmission path to a reference voltage). The filter block 701 also includes resonator 720A and resonator 720B, which are shunt resonators (e.g., resonators coupled between the reference element 770 and the transmission path which extends from the circuitry connection port 752 to the communication connection port 754).

The four resonators 710A, 710B, 720A, and 720B allow the wireless filter block 701 to provide one passband and one stopband (e.g., a notch frequency), a dual passband, and a dual stopband at the same time. Such resonators in a single topology (e.g., a topology connecting one input of the circuitry connection port 752 with one output of the communication connection port 754) can offer multiple passbands and/or stopbands, allowing the structure of the filter block 701 to provide flexible options for a device to support multiple bands, such as described above for dynamic spectrum sharing (DSS) and/or carrier aggregation (CA) functionality and/or for other multi-band functionality. The four resonators provide four different resonance frequencies. The different resonators can also be designed with different statice capacitances (e.g., impedances) and differing coupling characteristics, which when combined with a passive network and other components (e.g., as described below in FIGS. 8 and 9) allows a standardized structure to support many different bands. For example, in some aspects, an electroacoustic filter can include a resonator (e.g., one of resonators 710A or 710B) as part of a bandpass filter while another resonator (e.g., the other one of resonators 710A or 710B) is part of a notch filter, so that the set of parallel resonators in the series (e.g., transmission or signal) path includes one resonator configured for a bandpass filter and another resonator configured for a notch filter. In some examples then, similar to the above, one of the shunt resonators 720A or 720B contributes to a bandpass filter and the other of the shunt resonators 720A or 720B contributes to a notch filter, so that the set of parallel shunt resonators also includes a resonator that is part of the bandpass filter and a resonator that is part of the notch filter.

Figure 7B:
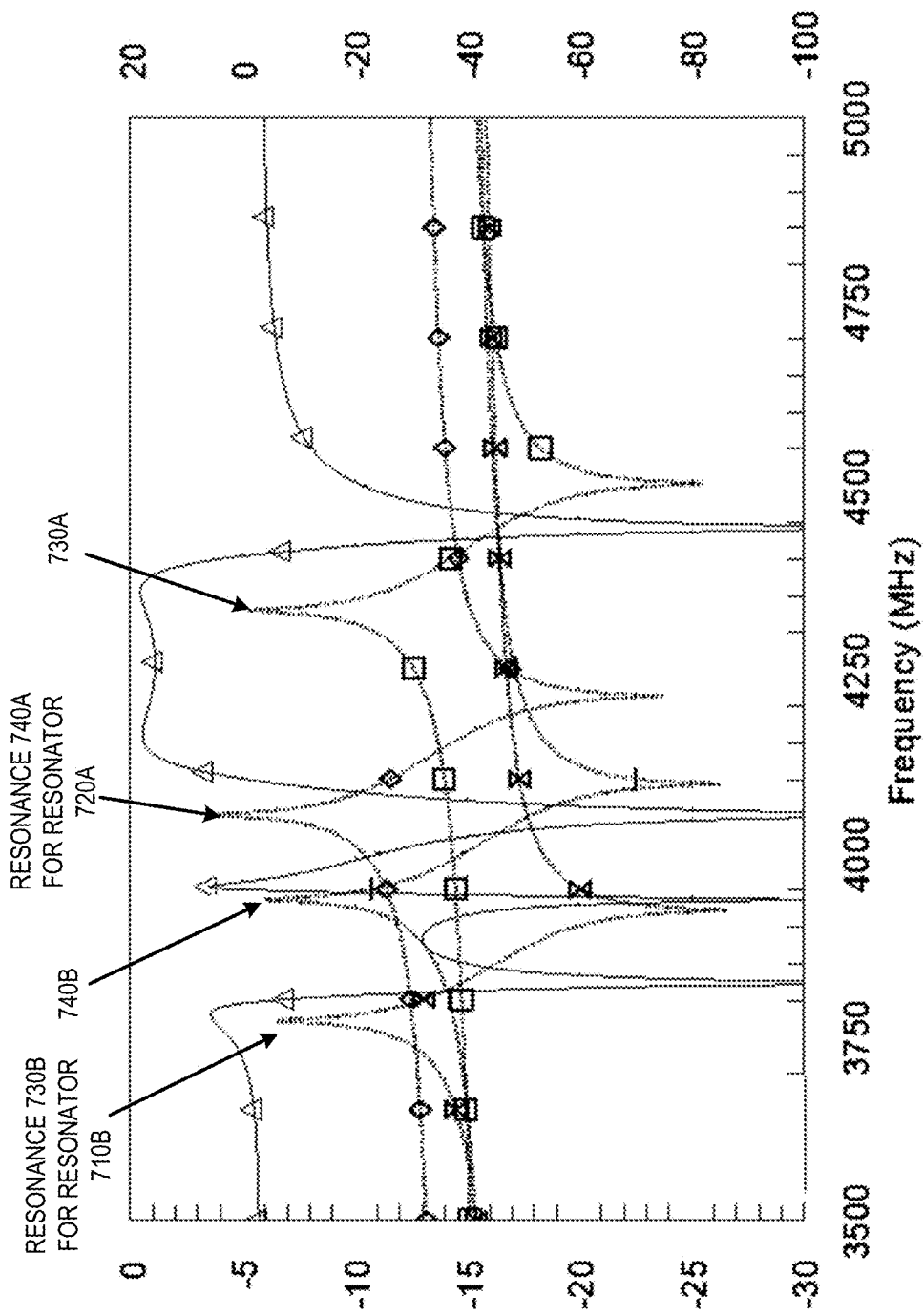
FIG. 7B is frequency chart illustrating aspects of a filter in accordance with examples described herein.

Further, as described herein, the pairs of resonators configured in a split pole structure can be used in a ladder type design to support flexible implementations of differing bands. As described herein, a split pole resonator structure describes two single resonators either in parallel or in series, with differing resonance frequencies. Parallel resonators are resonators with both ends connected, and serial resonators are resonators connected in a chain, such that both ends of each resonator are connected for parallel connection, and only one end of each resonator is connected to the other resonator for two resonators in series. In some configurations, the resonance frequencies are close (e.g., within a threshold frequency range such as 10 MHz, 5 MHz, etc. or within a threshold percentage of each other, such as 5%, 10%, etc.). In other configurations, no such restrictions are applied to the split pole resonators. The ladder structure with shunt resonators (e.g., resonators 720A and 720B) as well as series resonators (e.g., resonators 710A and 710B) configured as illustrated in FIG. 7B. The split pole structure allows design modifications with a change in resonance values and static capacitances to modify filter responses and band performance in a fine-tuned fashion. Such split pole designs can create response spikes, but the response spikes can be addressed by careful selection of split pole resonator values for a particular implementation.

FIG. 7B is frequency chart illustrating aspects of a filter in accordance with examples described herein. As described herein, a filter block such as the filter block 701 can be used for a variety of different the filter functions. The frequency chart of FIG. 7B illustrates aspects of the filter block 701 with the resonance values for the resonators (e.g., the resonators 710A, 710B, 720A, and 720B) configured for a filter function where frequencies for a band stop notch are below frequencies for a bandpass of the same the filter function. In other implementations, other such functions (e.g., multiple band passes, a band stop notch above a passband, etc.). The frequency chart of FIG. 7B shows the resonances 730A, 730B, 740A, and 740B for an associated filter function. In the example of FIG. 7B, the resonance 730A is associated with the resonator 710A, the resonance 730B is associated with the resonator 710B, the resonance 740A is associated with the resonator 720A, and the resonance 740B is associated with the resonator 720B. FIG. 7B not only illustrates a specific set of resonance frequencies for one configuration, but relationships between the resonator resonance frequencies that hold for similar configurations where frequencies of the band stop notch are lower than frequencies of the bandpass. For this filter function, (e.g., notch below bandpass) the resonance 730A of the resonator 710A and the resonance 740A of the resonator 720A are configured to influence the filter band pass. Similarly, for this filter function (e.g., notch below bandpass), the resonance 730B of the resonator 710B and the resonance 740B of the resonator 720B configured to influence the band stop frequencies. For an implementation having a band stop notch with a frequency below a frequency band of the bandpass frequencies, the resonance 730A of the resonator 710A is configured to be greater than the resonance 740A of the resonator 720A, the resonance 740A of the resonator 720A is configured to be greater than the resonance 740B of the resonator 720B, and the resonance 740B of the resonator 720B is configured to be greater than the resonance 730B of the resonator 710B. The frequency chart of FIG. 7B illustrates specific aspects of such a configuration, but additional configurations for the resonance frequencies of the filter block 701 will have the same relationships between the resonances of the resonators when the band stop notch frequencies are below the bandpass frequencies. Other filter functions are possible, for example when multiple bandpass frequency ranges are used in a single filter function, or when band stop notch frequencies are above a bandpass frequency range, as illustrated in FIG. 7C.

Figure 7C:
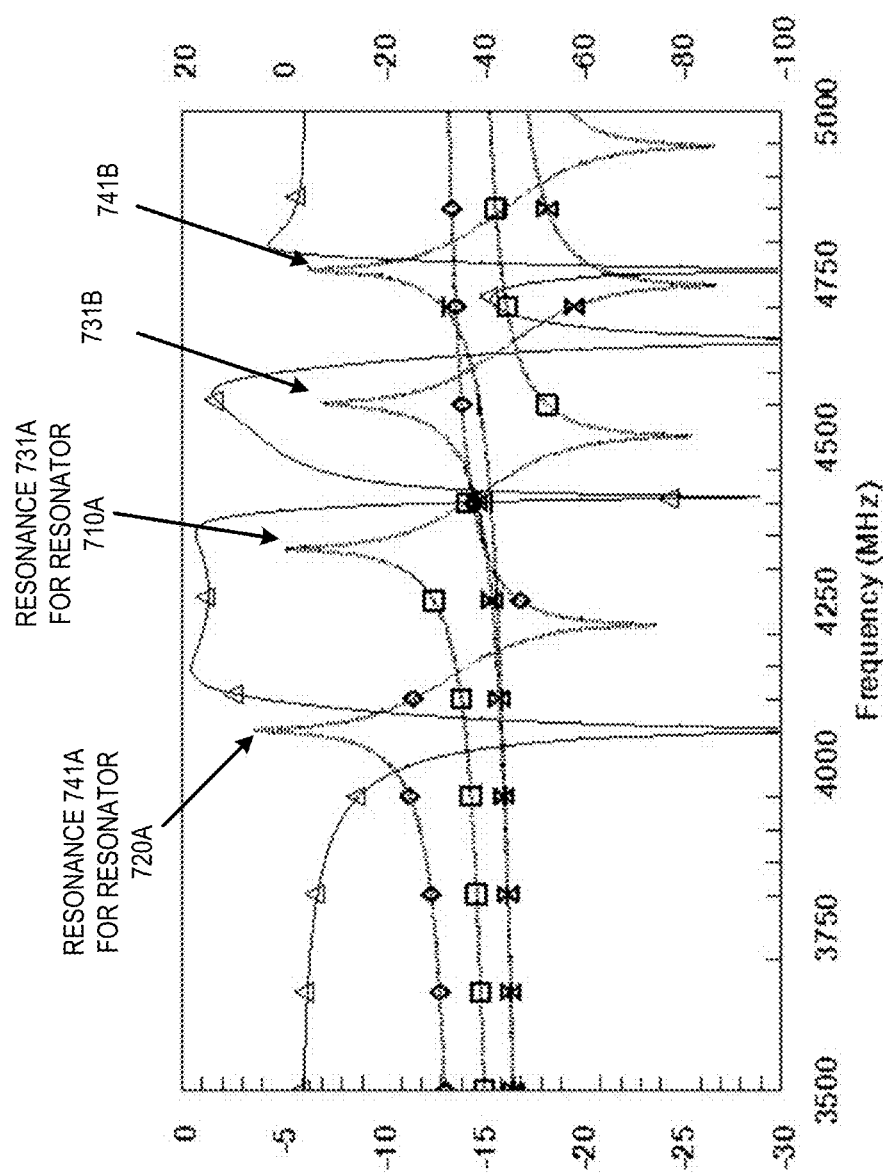
FIG. 7C is frequency chart illustrating aspects of a filter in accordance with examples described herein.

FIG. 7C is frequency chart illustrating aspects of a filter in accordance with examples described herein. Just as in FIG. 7B, FIG. 7C illustrates a frequency chart for a filter function associated with a configuration of the frequency block 701. The filter function configured in FIG. 7C, however, has the band stop notch frequencies above the bandpass frequencies.

For an implementation with a band stop notch with a frequency above a frequency band of the bandpass frequencies, a resonance 741B of resonator 720B is configured to be greater than a resonance 731B of resonator 710B, the resonance 731B of resonator 710B is configured to be greater than a resonance 731A of the resonator 710A, and the resonance 731A of the resonator 710A is configured to be greater than a resonance 741A of resonator 720A. For the above relative configurations of the resonance frequencies of the resonators, resonator 710A and resonator 720A are configured for the bandpass frequency, and resonators 710B and 720B are configured for a bandstop frequency as mentioned above.

In addition to the above examples of resonance configurations for certain filter functions, for a dual passband configuration, a resonance of resonator 710B is configured to be greater than a resonance of resonator 720B, a resonance of resonator 720B is configured to be greater than a resonance of resonator 710A, and a resonance of resonator 710A is configured to be greater than a resonance of resonator 720A. In such a configuration resonator 710A and resonator 720A are configured for a first bandpass frequency, and resonators 710B and 720B are configured for a second bandpass frequency.

Specific values of resonances and capacitances for resonators 710A, 710B, 720A, and 720B can be used to fine tune the particular performance in the context of the above structure. The values of the resonances and capacitances for resonators 710A, 710B, 720A also allow the four resonator structure of filter block 701 to be reused in many different structures to support different communication bands in a wireless communication apparatus.

Figure 7D:
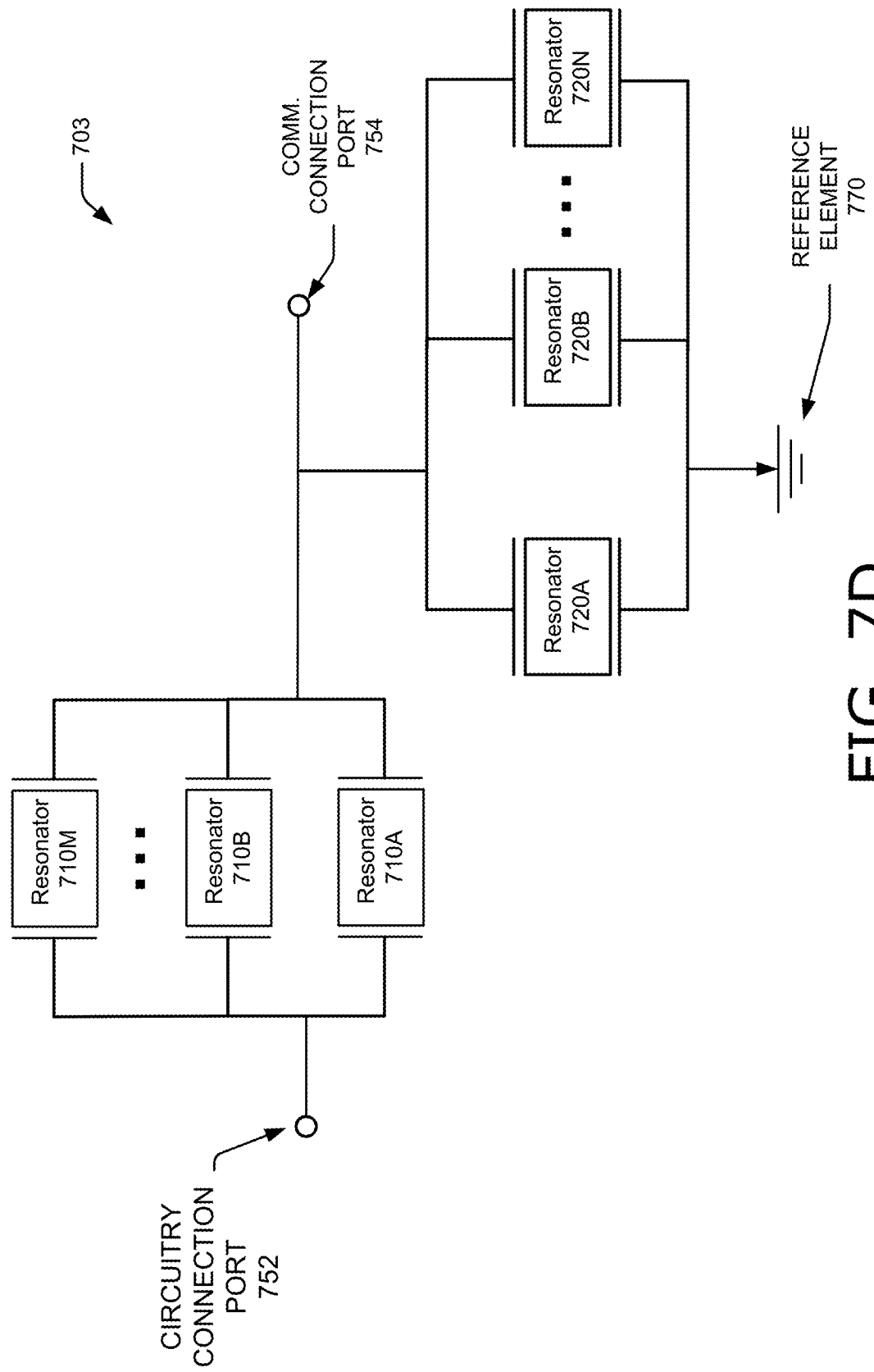
FIG. 7D is a schematic representation of aspects of a filter in accordance with examples described herein.

FIG. 7D is a schematic representation of aspects of a filter block 703 in accordance with examples described herein. While FIG. 7A above illustrates an example of a filter block 701 with four resonators, in some implementations additional improvements can be achieved by adding additional split pole resonators to a set of transmission split pole resonators or a set of shunt split pole resonators. The number of resonators in a split pole set is not limited, but for a particular design will depend on the tradeoff between complexity, size, and filter performance (e.g., based on the number of split pole resonators) from a particular design and associated values. Referring to FIG. 7D, as with filter block 701, filter block 703 includes a ladder structure, with a set of shunt split pole resonators (e.g., resonator 720A, resonator 720B, through 720N, where N is a value equal to or greater than 1) and a set of transmission split pole resonators (e.g., resonators 710A, 710B, through 710M, where M is a value equal to or greater than 1). The structure of filter block 703 can be considered a single rung of a larger ladder structure. The larger ladder structure can either include additional filter blocks 703, additional filter blocks 701, or any other such blocks of a ladder structure. A reference element 770 is used for one end of the set of shunt resonators 720A, 720B, through 720N, and the set of series resonators 710A, 710B, through 710M are connected to circuitry connection port 752 (e.g., connected to control circuitry such as circuitry 600) on one end and to communication connection port 754 on the other end.

Each resonator of filter block 703 is designated to operate as either a pass band filter or a notch filter or as part of a bandpass filter or part of a notch filter. Each set of resonators (e.g., the transmission set and the shunt set) will include at least one resonator assigned to the pass band filter. The other resonators of each set can either be assigned to notch filters or additional pass band filters. The structure of the filter block 703 allows any number of filter functions to be configured in the provided structure.

The filter block 703, either alone or in conjunction with other elements, can then filter signals for bands associated with the design of the filter block 703 element values for received signals at communication connection port 754 traveling to circuitry connection port 752, or for signals being transmitting from a wireless apparatus traveling from circuitry connection port 752 to communication connection port 754.

Figure 8:
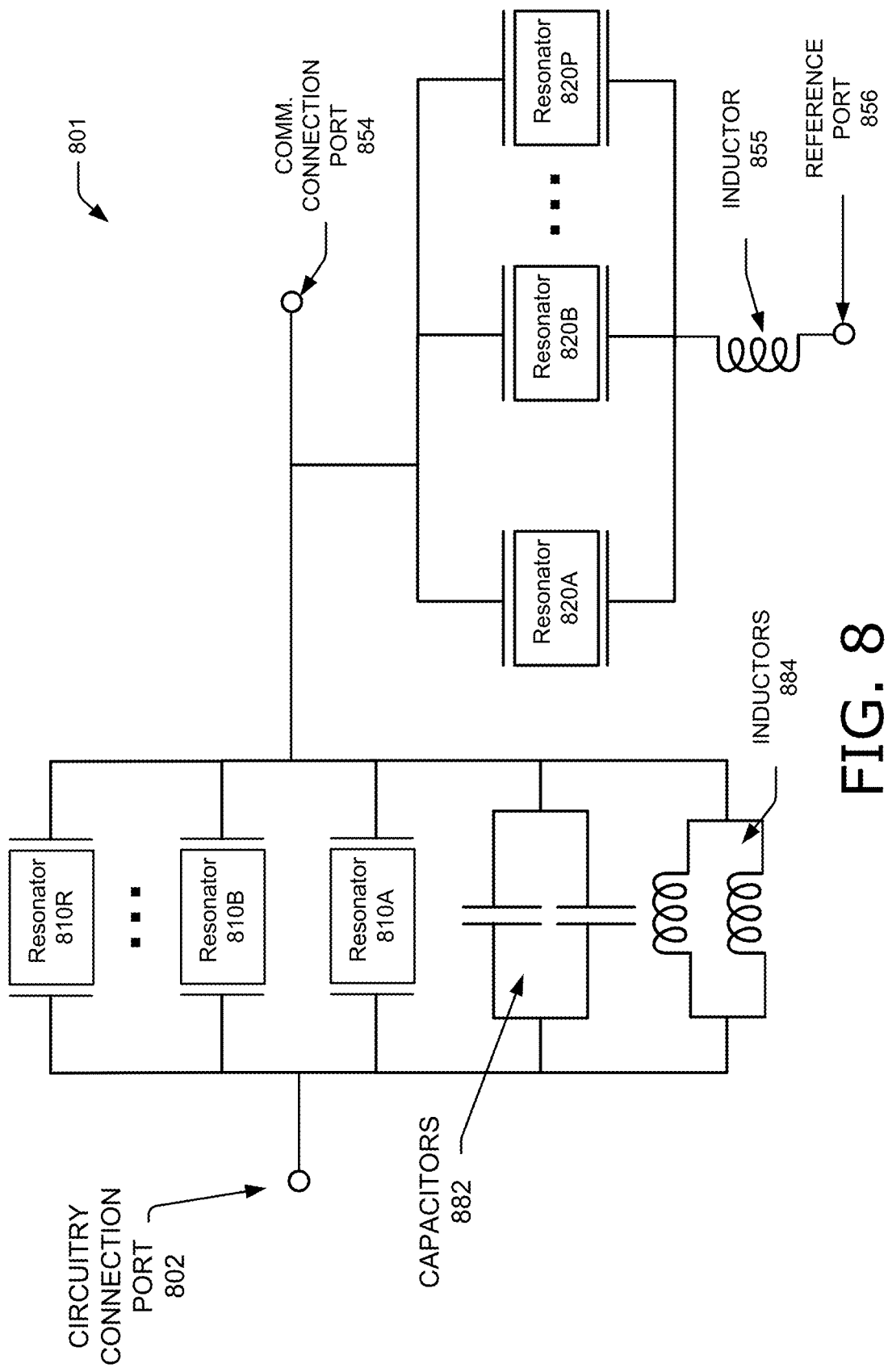
FIG. 8 is a schematic representation of a filter in accordance with examples described herein.

FIG. 8 is a schematic representation of a filter block 801 in accordance with examples described herein. As described above, FIG. 7A describes a four resonator filter that can be adapted for notch filtering and pass band filtering as described above. As further described above, FIG. 8 describes a structure where additional resonators can be added to provide further filtering options with the split pole resonator structure. The filter block 801 of FIG. 8 extends the structure with passive network elements in a structure to allow further tuning for the filter functions with a single topology. Filter block 801 includes series resonators (including series resonator 810A, series resonator 810B, through series resonator 810R, where R is a value equal to or greater than 1) coupled between circuitry connection port 802 and communication connection port 854. Filter block 801 includes shunt resonators 820A, 820B, through 820P (where P is a value equal to or greater than 1) coupled between the transmission path from circuitry connection port 802 and communication connection port 854 (e.g., at the communication connection port 854 side of the series resonators 810A, 810B, through 810R). These resonators are structured similarly to the resonators of filter block 703 in FIG. 7A. Filter block 801 of FIG. 8 additionally includes passive elements in the form of capacitors 882, inductors 884, and inductor 855.

The passive network elements in FIG. 8 (e.g., the capacitors 882, inductors 884, and inductor 855) can have element values configured to increase or decrease resonator coupling factors, set or tune the resonance and antiresonance frequencies of the resonators, improve gamma parameters (e.g., where gamma parameters describe aspects of a filter) for CA applications, and to control input and output filter phase characteristics of a filter including filter block 801. As mentioned above, each of the series resonators 810A, 810B, through 810R can be assigned a filter function. At least one series resonator is used in defining a pass band filter antiresonance frequency. Other series resonators can define notch filter resonance frequencies or notch frequency rejection (e.g., in combination with values of the passive elements, including capacitors 882 and inductors 884). Just as for the series resonators, each of the shunt resonators 820A, 820B, through 820P can also be assigned a filter function. The filter functions of the shunt resonators may match the series resonator functions, such that an assigned function can be associated with one or more series resonators as well as one or more shunt resonators. Just as with the series resonators, at least one shunt resonator will be configured to define the pass band filter. Other shunt resonators can be configured for notch filter performance. Shunt resonator configurations can, in some aspects provide additional degrees of freedom to increase a coupling factor and control a resonance frequency position by configuring a value of inductor 855 connected to reference port 856 (e.g., a ground reference) along with the configured values of the shunt resonators.

As described herein, resonators 810A-N can be considered as part of a serial resonator network. The serial network can be made up of interconnected resonators that are physically connected in a device. In some implementations, such a resonator network can further include additional elements such as capacitors 882 and inductors 884. In some implementations, such additional elements can be considered part of a passive network coupled to the resonator network. Similarly, resonators 820A-N can be considered as part of a shunt resonator network. The shunt resonator network of connected resonators can further include additional elements which may be used for tuning or adjusting filter performance for the filter(s) implemented using the resonators of the network. FIG. 8 includes inductor 855, which can be used for tuning filter performance as part of the shunt resonator network. Other examples of a shunt resonator network can include additional or alternative inductive or capacitive elements. In other implementations, such elements can be considered part of a separate passive network that can be used to tune the resonances that determine the filters associated with the resonator networks.

Figure 9:
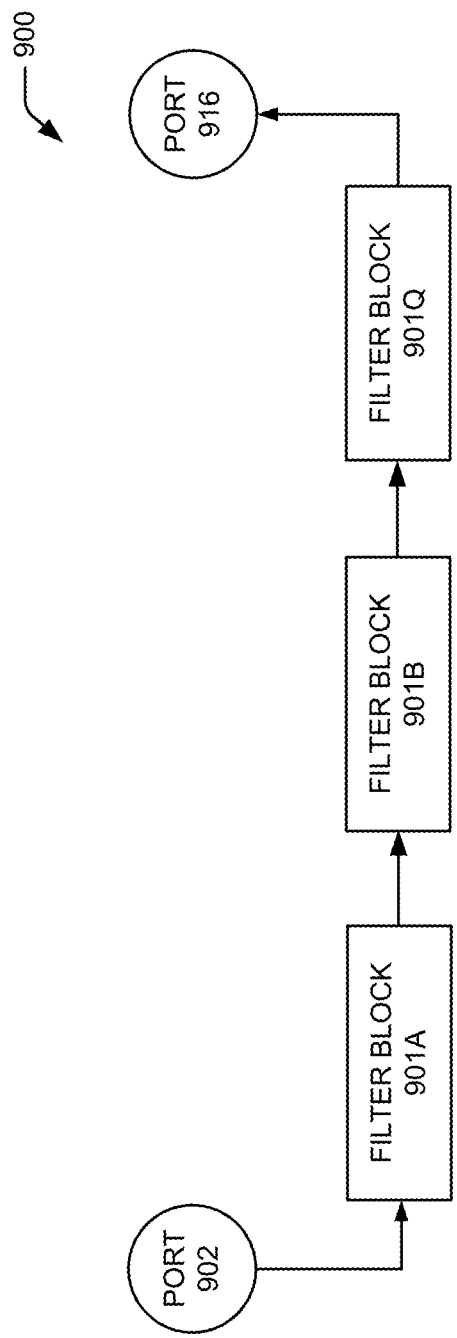
FIG. 9 is a schematic representation of aspects of a filter in accordance with examples described herein.

FIG. 9 is a schematic representation of aspects of a filter 900 in accordance with examples described herein. The filter blocks described above can be integrated in a ladder of filter blocks, or with other filter elements or structures, to create a filter such as the filter 900. Some implementations in particular can include ladders of the filter blocks 901A, 901B, through 901Q (where Q is a value equal to or greater than 1) to achieve any number of filter functions with a high level of configurability in one topology. Using a single topology limits some aspects of the filter complexity, while the tenability described above with respect to FIG. 8 allows a large number of filter functions. By creating the ladder structure of multiple filter blocks 901A, 901B, through 901Q (e.g., a chain of any number of filter blocks) having the structure of filter block 801, any number of filter functions tunable as described above for CA and DSS functionality can be created. In addition, in an example, one of the filter blocks 901A may be formed from a ladder network of FIG. 5A without the filter circuitry 509 in conjunction with the other filter blocks 901A, 901B, which may have configurations based on the principles described above with respect to FIGS. 7A and 8. In addition, a filter such as filter 900 can then be used, for example, as any filter of FIG. 5B with a multiplexer or switches to allow a wireless communication device to support any number of CA and DSS frequency bands. In such a configuration, the port 902 can be connected to control circuitry that generates signals for transmission, and the port 916 can be connected to an antenna used for transmitting signals generated by a wireless communication device and for receiving signals to be filtered by filter 900 and then processed by the control circuitry.

Figure 10:
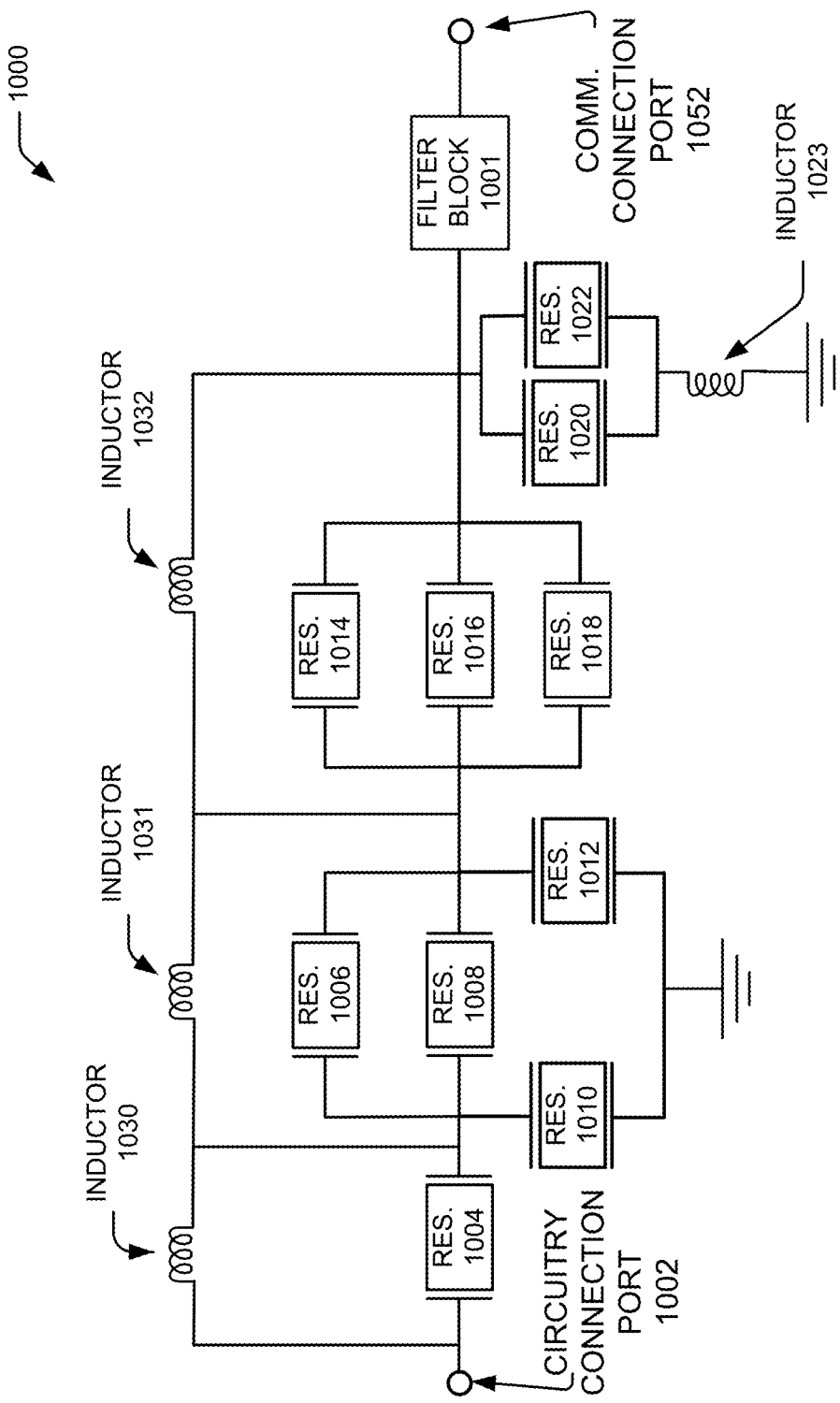
FIG. 10 is a schematic representation of aspects of a filter in accordance with examples described herein.

FIG. 10 is a schematic representation of aspects of a filter 1000 in accordance with examples described herein. While FIG. 9 describes ladder configurations using filter blocks (e.g., filter block 701 or 703 as implementations of filter blocks 901A, 901B, through 901Q) with split pole configurations as described herein combined with other filter structures, FIG. 10 illustrates an integration of filter topologies for a pass band, a first notch filter, and a second notch filter combined with a filter block 1001. The filter block 1001 can function as any filter block described above, with the remaining filter configurations to support a pass band and two notch filters. Such a filter supports any number of filter functions with less complexity than the ladder structure of multiple filter blocks 901A, 901B, through 901Q described above. When a filter block with four resonators (e.g., such as filter block 701) is used for filter block 1001, the filter functionality provided can match CA band performance with a limited number of resonators.

In the structure of filter 1000, the series resonators 1004, 1006, 1008, 1016, 1018, the shunt resonators 1010, 1012, 1020, and 1022, along with pass band resonators of filter block 1001 can be used for pass band function definition.

The resonator 1004 is connected to a circuitry connection port 1002. The signal path for series resonators is the path from the circuitry connection port 1002 to the communication connection port 1052. Resonators 1004, 1006, 1008, 1014, 1010, and 1012 can be used for a first notch filter definition, and inductors 1030, 1031, and 1032 can be used with selected shunt resonators to define a second notch filter. The structure of filter 1000 can then be used with selected element values for the resonators and inductors to define any filter function needed for CA or DSS operation in a device.

In defining filter functionality, the inductor 1030, 1031, and 1032 values can be used to shift low pole frequencies and adjust mid-band rejection. The inductors can also be configured to shift resonator antiresonance frequency positions in a passband. For example, inductor 1023 provides a value that can be adjusted in a filter design to provide an additional degree of freedom to increase resonator coupling. Some implementations may additionally use tuned capacitive elements in conjunction with inductor 1023 to provide further variation in the available tuning values to shift the resonator antiresonance frequency positions in a passband. Additionally, while such inductive elements can be adjusted to tune passbands, the sensitivity of the passband can be structured so that normal variation of inductive components have limited impact on the passband. In some implementations, if additional resonator coupling is not used in a design, inductor 1023 can be omitted.

Just as above, in some examples, filter 1000 can be used as any filter in the multiplexer of FIG. 5B, or filter 1000 can be used in conjunction with other elements to achieve performance, with the standardized layout of filter 1000 used to simplify filter designs and standardize a layout within a portion of a complex filter (e.g., to support complex CA and DSS functionality).

Figure 11:
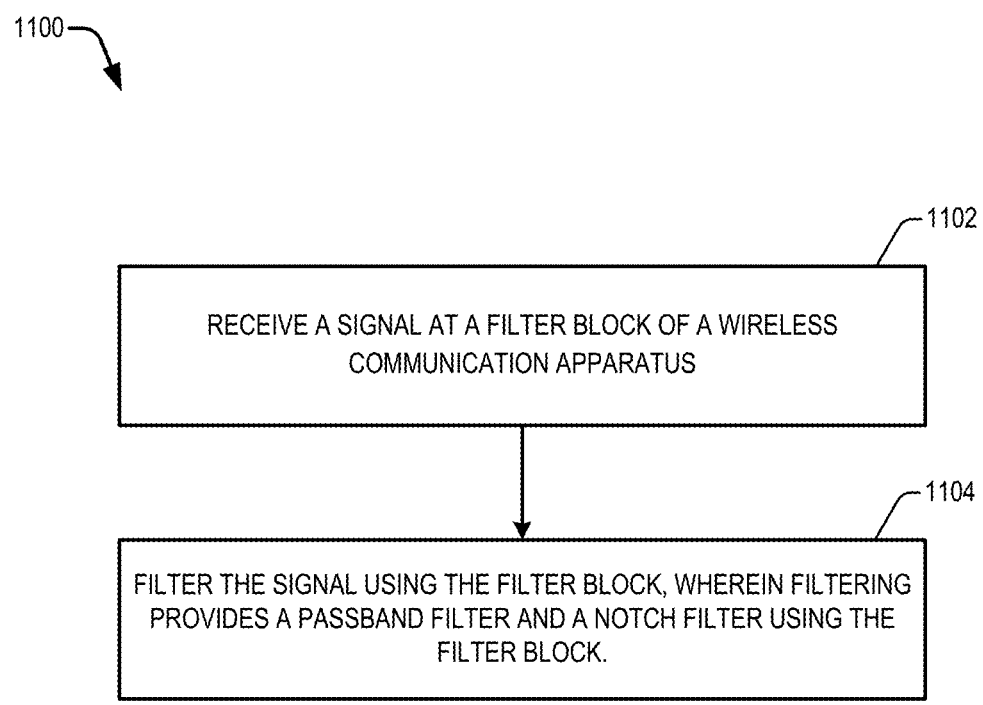
FIG. 11 is a flowchart illustrating a method in accordance with examples described herein.

FIG. 11 is a flowchart illustrating a method 1100 (or process) in accordance with examples described herein. The described method 1100 includes operations for filtering one or more signals in a wireless communication apparatus for a multi-band system. The method 1100 is described in the form of a set of blocks that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the method 1100, or an alternative approach.

At block 1102, the method 1100 includes receiving a signal at a filter block of the wireless communication apparatus. In the operation of block 1102, the operation functions with the filter block structured as described above. This filter block structure includes a first acoustic resonator configured with a first passband resonance, the first acoustic resonator having a first resonator side and a second resonator side, the first resonator side coupled to a circuitry connection port, and the second resonator side coupled to a communication connection port. The filter block structure further includes a second acoustic resonator configured with a stopband resonance, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator. The filter block structure includes a third acoustic resonator configured with a second passband resonance, the third acoustic resonator having a first resonator side and a second resonator side, the first resonator side of the third acoustic resonator coupled to the second resonator side of the first acoustic resonator, and first resonator side of the third acoustic resonator further coupled to the second resonator side of the second acoustic resonator. The filter block structure includes a fourth acoustic resonator configured with a stopband resonance, the fourth acoustic resonator having a first resonator side and a second resonator side, the fourth acoustic resonator coupled in parallel to the third acoustic resonator, with the first resonator side of the fourth acoustic resonator coupled to the first resonator side of the third acoustic resonator, and the second resonator side of the third acoustic resonator coupled to the second resonator side of the fourth acoustic resonator.

At block 1104, the method 1100 includes operations to filter the signal using the filter block described above. The filtering of block 1104 provides a bandpass filter and a notch filter using the filter block. Examples of such filter operations are illustrated, for example in FIGS. 7B and 7C above, to provide processed signals for operation in accordance with the function of a given communication system.

Figure 12:
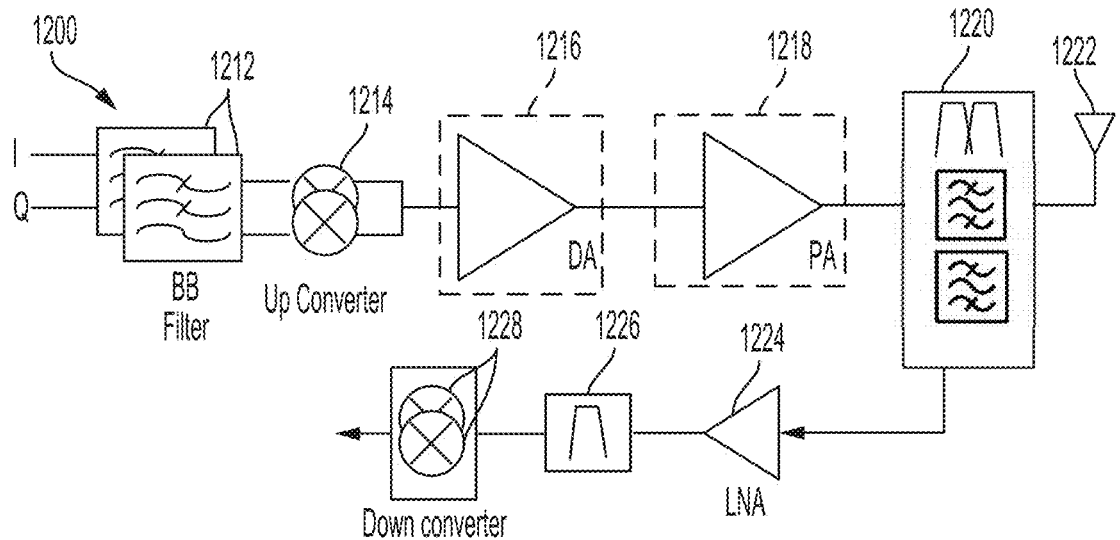
FIG. 12 is a functional block diagram of at least a portion of an example of a simplified wireless transceiver circuit in which the filter circuits and associated multiplexer structures described herein may be employed.

FIG. 12 is a functional block diagram of at least a portion of an aspect of a simplified wireless transceiver circuit 1200 in which the filter circuit 600 of FIG. 6 may be employed. The transceiver circuit 1200 is configured to receive signals/information for transmission (shown as I and Q values) which is provided to one or more base band filters 1212. The filtered output is provided to one or more mixers 1214. The output from the one or more mixers 1214 is provided to a driver amplifier 1216 whose output is provided to a power amplifier 1218 to produce an amplified signal for transmission. The amplified signal is output to the antenna 1222 through one or more filters 1220 (e.g., duplexers if used as a frequency division duplex transceiver or other filters). The one or more filters 1220 may include the filter circuit 600 of FIG. 6. The antenna 1222 may be used for both wirelessly transmitting and receiving data. The transceiver circuit 1200 includes a receive path through the one or more filters 1220 to be provided to a low noise amplifier (LNA) 1224 and a further filter 1226 and then down-converted from the receive frequency to a baseband frequency through one or more mixer circuits 1228 before the signal is further processed (e.g., provided to an analog digital converter and then demodulated or otherwise processed in the digital domain). There may be separate filters for the receive circuit (e.g., may have a separate antenna or have separate receive filters) that may be implemented using the filter circuit 600 of FIG. 6.

Figure 13:
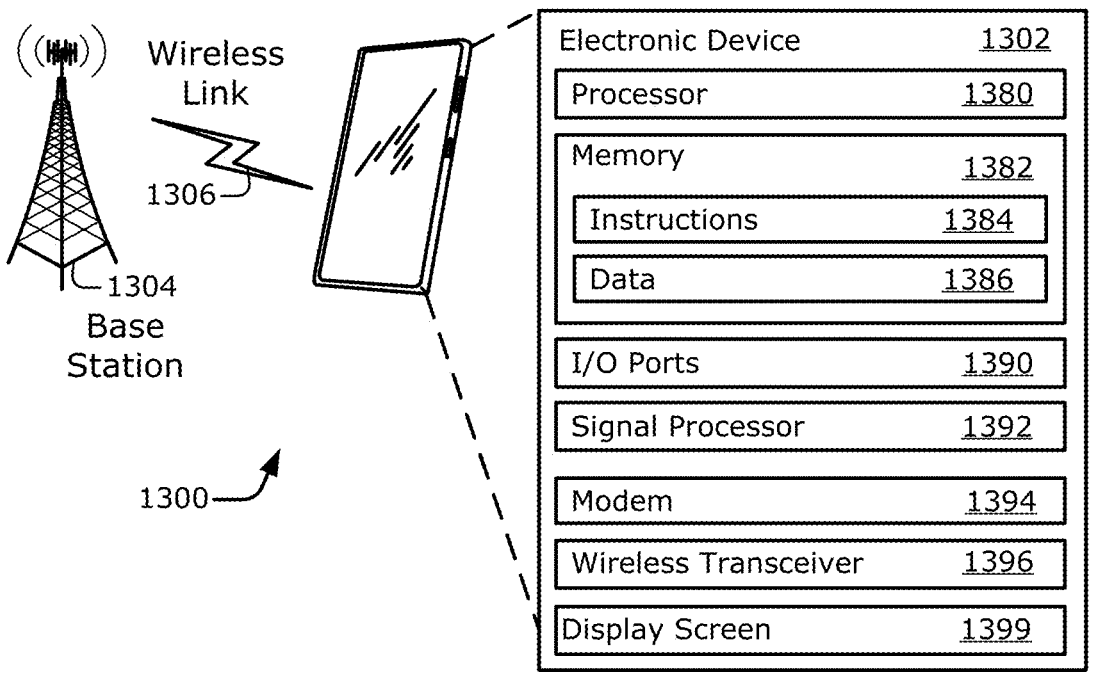
FIG. 13 is a diagram of an environment that includes an electronic device that includes a wireless transceiver such as the transceiver circuit of FIG. 12.

FIG. 13 is a diagram of an environment 1300 that includes an electronic device 1302 that includes a wireless transceiver 1396 such as the transceiver circuit 1200 of FIG. 12. In some aspects, the electronic device 1302 includes a display screen 1399 that can be used to display information associated with data transmitted via wireless link 1306 and processed using components of electronic device 1302 described below. Other aspects of an electronic device in accordance with aspects described herein using a low phase delay filter for multi-band communication can be configured without a display screen. In the environment 1300, the electronic device 1302 communicates with a base station 1304 through a wireless link 1306. As shown, the electronic device 1302 is depicted as a smart phone. However, the electronic device 1302 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, an automobile including a vehicle-based communication system, Internet of Things (IoT) device, sensor or security device, asset tracker, and so forth.

The base station 1304 communicates with the electronic device 1302 via the wireless link 1306, which may be implemented as any suitable type of wireless link. Although depicted as a base station tower of a cellular radio network, the base station 1304 may represent or be implemented as another device, such as a satellite, terrestrial broadcast tower, access point, peer to peer device, mesh network node, fiber optic line, another electronic device generally as described above, and so forth. Hence, the electronic device 1302 may communicate with the base station 1304 or another device via a wired connection, a wireless connection, or a combination thereof. The wireless link 1306 can include a downlink of data or control information communicated from the base station 1304 to the electronic device 1302 and an uplink of other data or control information communicated from the electronic device 1302 to the base station 1304. The wireless link 1306 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1302 includes a processor 1380 and a memory 1382. The memory 1382 may be or form a portion of a computer readable storage medium. The processor 1380 may include any type of processor, such as an application processor or a multi-core processor, that is configured to execute processor-executable instructions (e.g., code) stored by the memory 1382. The memory 1382 may include any suitable type of data storage media, such as volatile memory (e.g., random access memory (RAM)), non-volatile memory (e.g., Flash memory), optical media, magnetic media (e.g., disk or tape), and so forth. In the context of the disclosure, the memory 1382 is implemented to store instructions 1384, data 1386, and other information of the electronic device 1302, and thus when configured as or part of a computer readable storage medium, the memory 1382 does not include transitory propagating signals or carrier waves.

The electronic device 1302 may also include input/output ports 1390. The I/O ports 1390 enable data exchanges or interaction with other devices, networks, or users or between components of the device.

The electronic device 1302 may further include a signal processor (SP) 1392 (e.g., such as a digital signal processor (DSP)). The signal processor 1392 may function similar to the processor and may be capable executing instructions and/or processing information in conjunction with the memory 1382.

For communication purposes, the electronic device 1302 also includes a modem 1394, a wireless transceiver 1396, and an antenna (not shown). The wireless transceiver 1396 provides connectivity to respective networks and other electronic devices connected therewith using radio-frequency (RF) wireless signals and may include the transceiver circuit 1200 of FIG. 12. The wireless transceiver 1396 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of aspect, an element, or any portion of an element, or any combination of elements described herein may be implemented as a "processing system" that includes one or more processors. Aspects of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout the disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more aspect embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of aspect, and not limitation, such computer-readable media can include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

The phrase "coupled to" and the term "coupled" refers to any component that is physically connected to another component either directly or indirectly, and/or any component that is in communication with another component (e.g., connected to the other component over a wired or wireless connection, and/or other suitable communication interface) either directly or indirectly.

Generally, where there are operations illustrated in figures, those operations may have corresponding counterpart means-plus-function components with similar numbering.

As used herein, the term "determining" encompasses a wide variety of actions. For aspect, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an aspect, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

Illustrative aspects of the disclosure include:

Aspect 1: A wireless communication apparatus comprising: a first acoustic resonator that is a part of a first bandpass filter having a first passband, the first acoustic resonator having a first resonator side and a second resonator side, the first resonator side coupled to a circuitry connection port, and the second resonator side coupled to a communication connection port; a second acoustic resonator that is part of one of a second bandpass filter having a second passband or a notch filter having a stopband, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator; a third acoustic resonator that is part of the first bandpass filter, the third acoustic resonator having a first resonator side and a second resonator side, the first resonator side of the third acoustic resonator coupled to the second resonator side of the first acoustic resonator, the first resonator side of the third acoustic resonator further coupled to the second resonator side of the second acoustic resonator, the second resonator side of the third acoustic resonator coupled to a reference potential; and a fourth acoustic resonator that is part of one of the second bandpass filter or the notch filter, the fourth acoustic resonator having a first resonator side and a second resonator side, the fourth acoustic resonator coupled in parallel to the third acoustic resonator, with the first resonator side of the fourth acoustic resonator coupled to the first resonator side of the third acoustic resonator, and the second resonator side of the third acoustic resonator coupled to the second resonator side of the fourth acoustic resonator and the reference potential.

Aspect 2: The wireless communication apparatus of aspect 1, further comprising a ladder network of resonators coupled to the circuitry connection port.

Aspect 3: The wireless communication apparatus of aspect 2, wherein the ladder network of resonators includes at least one of: an additional resonator as part of one of the notch filter or the second bandpass filter; or an additional resonator as part of the first bandpass filter.

Aspect 4: The wireless communication apparatus of any of aspects 1 to 3, wherein: the second acoustic resonator is part of the notch filter and the fourth acoustic resonator is part of the notch filter; the stopband is at frequencies greater than frequencies of the first passband; and a resonance value for the first acoustic resonator is greater than a resonance value for the second acoustic resonator, the resonance value for the second acoustic resonator is greater than a resonance value for the fourth acoustic resonator, and the resonance value for the fourth acoustic resonator is greater than a resonance value for the third acoustic resonator.

Aspect 5: The wireless communication apparatus of any of aspects 1 to 3, wherein the second acoustic resonator is part of the second bandpass filter and the fourth acoustic resonator is part of the second bandpass filter; and wherein a resonance value for the third acoustic resonator is greater than a resonance value for the fourth acoustic resonator, the resonance value for the fourth acoustic resonator is greater than a resonance value for the first acoustic resonator, and the resonance value for the first acoustic resonator is greater than a resonance value for the second acoustic resonator.

Aspect 6: The wireless communication apparatus of any of aspects 1 to 5, wherein the reference potential is a ground potential.

Aspect 7: The wireless communication apparatus of any of aspects 1 to 6, further comprising control circuitry coupled to the circuitry connection port and multiplexer circuitry coupled to the communication connection port.

Aspect 8: The wireless communication apparatus of any of aspects 1 to 7, further comprising a combined filter configured as a bandpass filter, a first notch filter, and a second notch filter, the combined filter including the first acoustic resonator, the second acoustic resonator, the third acoustic resonator, and the fourth acoustic resonator.

Aspect 9: The wireless communication apparatus of aspect 8, wherein the first acoustic resonator and the second acoustic resonator form a serial resonator network.

Aspect 10: The wireless communication apparatus of aspect 9, wherein the serial resonator network is configured to define an antiresonance pass band filter frequency.

Aspect 11: The wireless communication apparatus of any of aspects 9 or 10, wherein the serial resonator network is configured to define a first notch filter resonance.

Aspect 12: The wireless communication apparatus of any of aspects 9 to 11, further comprising a passive network in parallel with the serial resonator network.

Aspect 13: The wireless communication apparatus of aspect 12, wherein the passive network comprises a plurality of capacitors in parallel with the serial resonator network and a plurality of inductors in parallel with the serial resonator networ.

Aspect 14: The wireless communication apparatus of any of aspects 12 or 13, wherein element values of the passive network configure gamma parameters for the combined filter, the element values of the passive network configure input and output phase values for the combined filter, and the element values of the passive network further configure notch rejection values for the combined filter.

Aspect 15: The wireless communication apparatus of any of aspects 8 to 14, wherein the third acoustic resonator and the fourth acoustic resonator form a shunt resonator network.

Aspect 16: The wireless communication apparatus of aspect 15, wherein the shunt resonator network defines a pass band filter resonance frequency for the first bandpass filter.

Aspect 17: The wireless communication apparatus of aspect 16, wherein the shunt resonator network modifies a notch filter antiresonance frequency for the combined filter.

Aspect 18: The wireless communication apparatus of any of aspects 16 or 17, wherein the shunt resonator network is configured to modify a coupling factor for the combined filter.

Aspect 19: The wireless communication apparatus of aspect 18, further comprising an inductor coupled between a reference potential and the second resonator side of the third acoustic resonator.

Aspect 20: A wireless communication apparatus comprising one or more filter blocks, each filter block of the one or more filter blocks comprising a set of two or more split pole series resonators, the set of two or more split pole series resonators comprising: a first acoustic resonator configured with a first passband resonance, the first acoustic resonator having a first resonator side and a second resonator side, the first resonator side coupled to a circuitry connection port, and the second resonator side coupled to a communication connection port; and a second acoustic resonator configured with a stopband resonance, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator.

Aspect 21: The wireless communication apparatus of aspect 21, the set of two or more split pole series resonators further comprising a third acoustic resonator configured with a second passband resonance, the third acoustic resonator having a first resonator side and a second resonator side, the first resonator side of the third acoustic resonator coupled to the second resonator side of the first acoustic resonator, and first resonator side of the third acoustic resonator further coupled to the second resonator side of the second acoustic resonator; and a fourth acoustic resonator configured with a stopband resonance, the fourth acoustic resonator having a first resonator side and a second resonator side, the fourth acoustic resonator coupled in parallel to the third acoustic resonator, with the first resonator side of the fourth acoustic resonator coupled to the first resonator side of the third acoustic resonator, and the second resonator side of the third acoustic resonator coupled to the second resonator side of the fourth acoustic resonator.

Aspect 22: The wireless communication apparatus of any of aspects 20 to 21, further comprising a first filter block, a second filter block, and a third filter block.

Aspect 23: The wireless communication apparatus of aspect 22, wherein the circuitry connection port of the second filter block is coupled to the communication connection port of the first filter block, and where the circuitry connection port of the third filter block is coupled to the communication connection port of the second filter block.

Aspect 24: The wireless communication apparatus of any of aspects 22 to 23, further comprising: control circuitry coupled to the circuitry connection port of the first filter block; and an antenna coupled to the communication connection port of the third filter block.

Aspect 25: The wireless communication apparatus any of aspects 20 to 24, further comprising a ladder network of resonators coupled to the circuitry connection port.

Aspect 26: A method of filtering one or more signals in a wireless communication apparatus, the method comprising: receiving a signal at a filter block of the wireless communication apparatus, the filter block including: a first acoustic resonator that is part of a first bandpass filter having a first passband, the first acoustic resonator having a first resonator side and a second resonator side, the first resonator side coupled to a circuitry connection port, and the second resonator side coupled to a communication connection port; a second acoustic resonator that is part of one of a second bandpass filter having a second passband or a notch filter having stopband, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator; a third acoustic resonator that is part of the first bandpass filter, the third acoustic resonator having a first resonator side and a second resonator side, the first resonator side of the third acoustic resonator coupled to the second resonator side of the first acoustic resonator, the first resonator side of the third acoustic resonator further coupled to the second resonator side of the second acoustic resonator, and the second resonator side of the third acoustic resonator coupled to a reference potential; a fourth acoustic resonator that is part of one of the second bandpass filter or the notch filter, the fourth acoustic resonator having a first resonator side and a second resonator side, the fourth acoustic resonator coupled in parallel to the third acoustic resonator, with the first resonator side of the fourth acoustic resonator coupled to the first resonator side of the third acoustic resonator, and the second resonator side of the third acoustic resonator coupled to the second resonator side of the fourth acoustic resonator and the reference potential; and filtering the signal using the filter block.

Aspect 27: The method of aspect 26, further comprising operations according to any of aspects 1 to 26.

Aspect 28: A wireless communication apparatus comprising: a bandpass filter having a bandpass filter response and including a first acoustic resonator coupled between a circuitry connection port and a communication connection port, the bandpass filter further including a third acoustic resonator coupled between the first acoustic resonator and a reference potential in a shunt path; and a notch filter having a stopband filter response and including a second acoustic resonator coupled in parallel with the first acoustic resonator between the circuitry connection port and the communication connection port, the notch filter further including a fourth acoustic resonator coupled in parallel with the third acoustic resonator.

Aspect 29: The wireless communication apparatus of Aspect 28, wherein the fourth acoustic resonator is in the shunt path between a signal path and the reference potential.

Aspect 30: The wireless communication apparatus of any of Aspects 28 or 29, wherein the bandpass filter further includes one or more resonators of a ladder network of resonators coupled to the circuitry connection port, and wherein the ladder network of resonators includes one or more additional resonators as part of the notch filter.

Aspect 31: The wireless communication apparatus of any of Aspects 28 to 30, wherein a resonance value for the third acoustic resonator is greater than a resonance value for the fourth acoustic resonator, the resonance value for the fourth acoustic resonator is greater than a resonance value for the first acoustic resonator, and the resonance value for the first acoustic resonator is greater than a resonance value for the second acoustic resonator.

Aspect 32: A wireless communication apparatus according to any of aspects 1 through 31.

Aspect 33: A method in accordance with any of the operations of aspects 1 through 31.

Aspect 34: A computer readable storage medium comprising instructions that, when executed by one or more processors of a device, cause the device to perform operations according to any of aspects 1 through 30.

Aspect 35: An apparatus comprising one or more means for performing operations according to any of aspects 1 through 31.

What is claimed is:

1. A wireless communication apparatus comprising:
a first acoustic resonator that is a part of a first bandpass filter having a first passband, the first acoustic resonator having a first resonator side and a second resonator side, the first resonator side coupled to a circuitry connection port, and the second resonator side coupled to a communication connection port;
a second acoustic resonator that is part of a notch filter having a stopband, the second acoustic resonator having a first resonator side and a second resonator side, the second acoustic resonator coupled in parallel to the first acoustic resonator with the first resonator side of the second acoustic resonator directly coupled to the first resonator side of the first acoustic resonator, and the second resonator side of the first acoustic resonator directly coupled to the second resonator side of the second acoustic resonator;
a third acoustic resonator that is part of the first bandpass filter, the third acoustic resonator having a first resonator side and a second resonator side, the first resonator side of the third acoustic resonator directly coupled to the second resonator side of the first acoustic resonator, and the second resonator side of the third acoustic resonator directly coupled to a reference potential; and
a fourth acoustic resonator that is part of the notch filter, the fourth acoustic resonator having a first resonator side and a second resonator side, the fourth acoustic resonator coupled in parallel to the third acoustic resonator, with the first resonator side of the fourth acoustic resonator directly coupled to the second resonator side of the first acoustic resonator, and the second resonator side of the third acoustic resonator directly coupled to the second resonator side of the fourth acoustic resonator and the reference potential,
wherein resonance values associated with the first acoustic resonator and the third acoustic resonator forming the first bandpass filter are less than resonance values associated with the second acoustic resonator and the fourth acoustic resonator forming the notch filter, and
wherein a resonant frequency of the second acoustic resonator and an antiresonant frequency of the fourth acoustic resonator are within a range of less than 100 megahertz (MHz).

2. The wireless communication apparatus of claim 1, further comprising a combined filter configured as a bandpass filter, a first notch filter, and a second notch filter, the combined filter including the first acoustic resonator, the second acoustic resonator, the third acoustic resonator, and the fourth acoustic resonator.

3. The wireless communication apparatus of claim 2, wherein the first acoustic resonator and the second acoustic resonator form a serial resonator network.

4. The wireless communication apparatus of claim 3, wherein the serial resonator network is configured to define an antiresonance pass band filter frequency.

5. The wireless communication apparatus of claim 4, wherein the serial resonator network is configured to define a first notch filter resonance.

6. The wireless communication apparatus of claim 5, further comprising a passive network in parallel with the serial resonator network.

7. The wireless communication apparatus of claim 6, wherein the passive network comprises a plurality of capacitors in parallel with the serial resonator network and a plurality of inductors in parallel with the serial resonator network.

8. The wireless communication apparatus of claim 6, wherein element values of the passive network configure gamma parameters for the combined filter, the element values of the passive network configure input and output phase values for the combined filter, and the element values of the passive network further configure notch rejection values for the combined filter.

9. The wireless communication apparatus of claim 2, wherein the third acoustic resonator and the fourth acoustic resonator form a shunt resonator network.

10. The wireless communication apparatus of claim 9, wherein the shunt resonator network defines a pass band filter resonance frequency for the first bandpass filter.

11. The wireless communication apparatus of claim 10, wherein the shunt resonator network modifies a notch filter antiresonance frequency for the combined filter.

12. The wireless communication apparatus of claim 11, wherein the shunt resonator network is configured to modify a coupling factor for the combined filter.

13. The wireless communication apparatus of claim 1, further comprising a ladder network of resonators coupled to the circuitry connection port.

14. The wireless communication apparatus of claim 13, wherein the ladder network of resonators includes at least one of: an additional resonator as part of the notch filter; or an additional resonator as part of the first bandpass filter.

15. The wireless communication apparatus of claim 1, wherein a resonance value for the second acoustic resonator is less than a resonance value for the fourth acoustic resonator.

16. The wireless communication apparatus of claim 1, wherein the reference potential is a ground potential.

17. The wireless communication apparatus of claim 1, further comprising control circuitry coupled to the circuitry connection port and multiplexer circuitry coupled to the communication connection port.

18. The wireless communication apparatus of claim 1, further comprising an inductor coupled between a reference potential and the second resonator side of the third acoustic resonator.

19. The wireless communication apparatus of claim 1, wherein at least one of the first acoustic resonator or the second acoustic resonator defines at least in part a pass band filter antiresonance frequency.

20. A wireless communication apparatus, comprising:
a bandpass filter having a bandpass filter response and including a first acoustic resonator coupled between a circuitry connection port and a communication connection port, the bandpass filter further including a third acoustic resonator coupled to a terminal end of the first acoustic resonator and a reference potential in a shunt path; and
a notch filter having a stopband filter response and including a second acoustic resonator directly coupled in parallel with the first acoustic resonator, the notch filter further including a fourth acoustic resonator coupled to the terminal end of the first acoustic resonator and in parallel with the third acoustic resonator,
wherein resonance values associated with the first acoustic resonator and the third acoustic resonator forming the bandpass filter are less than resonance values associated with the second acoustic resonator and the fourth acoustic resonator forming the notch filter, and
wherein a resonant frequency of the second acoustic resonator and an antiresonant frequency of the fourth acoustic resonator are within a range of less than 100 megahertz (MHz).

21. The wireless communication apparatus of claim 20, wherein the fourth acoustic resonator is in the shunt path between a signal path and the reference potential.

22. The wireless communication apparatus of claim 20, wherein the bandpass filter further includes one or more resonators of a ladder network of resonators coupled to the circuitry connection port, and wherein the ladder network of resonators includes one or more additional resonators as part of the notch filter.

23. A method of filtering one or more signals in a wireless communication apparatus, the method comprising:
receiving a signal at a filter block of the wireless communication apparatus, the filter block including:
a first acoustic resonator that is part of a first bandpass filter having a first passband, the first acoustic resonator having a first resonator side and a second resonator side, the first resonator side coupled to a circuitry connection port, and the second resonator side coupled to a communication connection port;
a second acoustic resonator that is part of a notch filter having a stopband, the second acoustic resonator having a first resonator side and a second resonator side, the second acoustic resonator coupled in parallel to the first acoustic resonator with the first resonator side of the second acoustic resonator coupled to the first resonator side of the first acoustic resonator, and the second resonator side of the first acoustic resonator coupled to the second resonator side of the second acoustic resonator;
a third acoustic resonator that is part of the first bandpass filter, the third acoustic resonator having a first resonator side and a second resonator side, the first resonator side of the third acoustic resonator coupled to the communication connection port, and the second resonator side of the third acoustic resonator coupled to a reference potential; and
a fourth acoustic resonator that is part of one of the notch filter, the fourth acoustic resonator having a first resonator side and a second resonator side, the fourth acoustic resonator coupled in parallel to the third acoustic resonator, with the first resonator side of the fourth acoustic resonator coupled to the communication connection port, and the second resonator side of the third acoustic resonator coupled to the second resonator side of the fourth acoustic resonator and the reference potential; and
filtering the signal using the filter block,
wherein resonance values associated with the first acoustic resonator and the third acoustic resonator forming the first bandpass filter are less than resonance values associated with the second acoustic resonator and the fourth acoustic resonator forming the notch filter, and
wherein a resonant frequency of the second acoustic resonator and an antiresonant frequency of the fourth acoustic resonator are within a range of less than 100 megahertz (MHz).

24. The method of claim 23, wherein the filter block further comprises a ladder network of resonators coupled to the circuitry connection port.

\* \* \* \* \*